（12） United States Patent
Asahi et al.

(10) Patent No.: US 8,064,213 B2
(45) Date of Patent: Nov. 22, 2011

(54) MODULE WITH A BUILT-IN COMPONENT, AND ELECTRONIC DEVICE WITH THE SAME

(75) Inventors: Toshiyuki Asahi, Hirakata (JP); Seiji Karashima, Hirakata (JP); Takashi Ichiryu, Moriguchi (JP); Seiichi Nakatani, Hirakata (JP); Tousaku Nishiyama, Nara (JP)

(73) Assignee: Panasonic Corporation, Osaka (JP)

( * ) Notice: Subject to any disclaimer, the term of this patent is extended or adjusted under 35 U.S.C. 154(b) by 1535 days.

(21) Appl. No.: 11/043,123

(22) Filed: Jan. 27, 2005

(65) Prior Publication Data

US 2005/0168960 A1 Aug. 4, 2005

(30) Foreign Application Priority Data

Jan. 30, 2004 (JP) ................................ P2004-022963

(51) Int. Cl.
*H05K 1/18* (2006.01)

(52) U.S. Cl. .................................... 361/761; 361/784

(58) Field of Classification Search .......... 361/761–764, 361/792, 760, 600, 679.01, 688, 704, 707, 361/748, 784, 785; 174/250–255, 68.01, 174/260–261; 428/98, 209, 210, 901; 438/381, 438/396, 710, 584, 597
See application file for complete search history.

(56) References Cited

U.S. PATENT DOCUMENTS

| | | | | |
|---|---|---|---|---|
| 4,682,270 A | * | 7/1987 | Whitehead et al. | 361/764 |
| 5,235,131 A | * | 8/1993 | Mueller et al. | 174/350 |
| 5,835,988 A | * | 11/1998 | Ishii | 257/684 |
| 5,962,917 A | | 10/1999 | Moriyama | |
| 5,973,395 A | * | 10/1999 | Suzuki et al. | 257/692 |
| 6,232,142 B1 | * | 5/2001 | Yasukawa | 438/69 |
| 6,433,418 B1 | * | 8/2002 | Fujisawa et al. | 257/696 |
| 6,528,353 B2 | * | 3/2003 | Suh et al. | 438/121 |
| 6,646,335 B2 | * | 11/2003 | Emoto | 257/686 |
| 6,770,981 B2 | * | 8/2004 | Jiang et al. | 257/782 |
| 7,042,717 B2 | * | 5/2006 | El-Batal et al. | 361/679.33 |
| 7,639,513 B2 | * | 12/2009 | Otsuki | 361/818 |
| 2004/0151882 A1 | * | 8/2004 | Tani et al. | 428/209 |
| 2004/0156177 A1 | * | 8/2004 | Higashitani | 361/777 |
| 2005/0040508 A1 | * | 2/2005 | Lee | 257/686 |

FOREIGN PATENT DOCUMENTS

| | | |
|---|---|---|
| CN | 1198009 | 11/1998 |
| EP | 0 847 088 | 6/1998 |
| EP | 0 867 939 | 9/1998 |

(Continued)

OTHER PUBLICATIONS

Office Action in CN Patent Application No. 200510004772.3 of Oct. 26, 2007 (translation).

*Primary Examiner* — Hung S Bui

(74) *Attorney, Agent, or Firm* — Wenderoth, Lind & Ponack, L.L.P.

(57) ABSTRACT

A module with a built-in component is provided which can be produced without a via-forming step. The module with a built-in component 100 includes an insulating sheet substrate 10 which has an upper surface 10a, a lower surface 10b opposed to the upper surface 10b and a side surface 10c which connects these surfaces. At least one wiring 20 extends from the upper surface to the lower surface through the side surface, and an electronic component 32 is disposed within the sheet substrate.

23 Claims, 28 Drawing Sheets

FOREIGN PATENT DOCUMENTS

| | | |
|---|---|---|
| EP | 0 920 058 | 6/1999 |
| JP | 61-34963 | 2/1986 |
| JP | 11-195729 | 7/1999 |
| JP | 11-220262 | 8/1999 |
| JP | 2000-312060 | 11/2000 |
| JP | 2002-231755 | 8/2002 |
| JP | 2004-146856 | 5/2004 |

* cited by examiner

Fig. 8
(a) 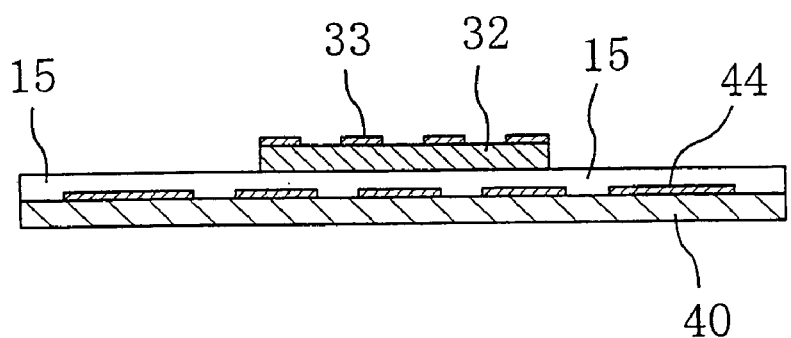
(b) 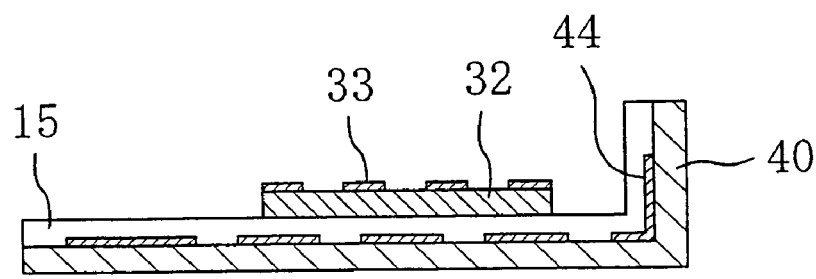
(c) 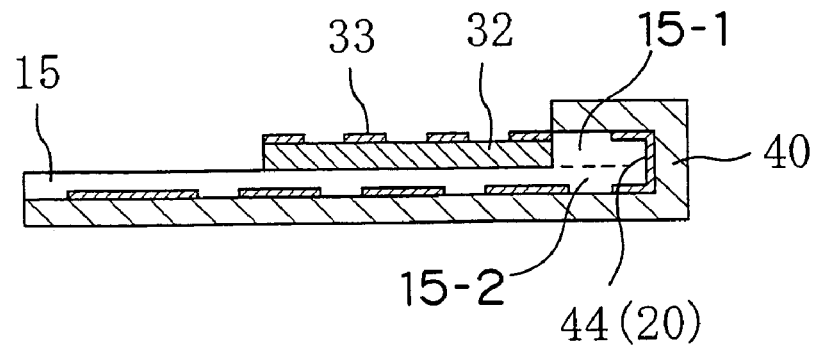

Fig.56
(a)
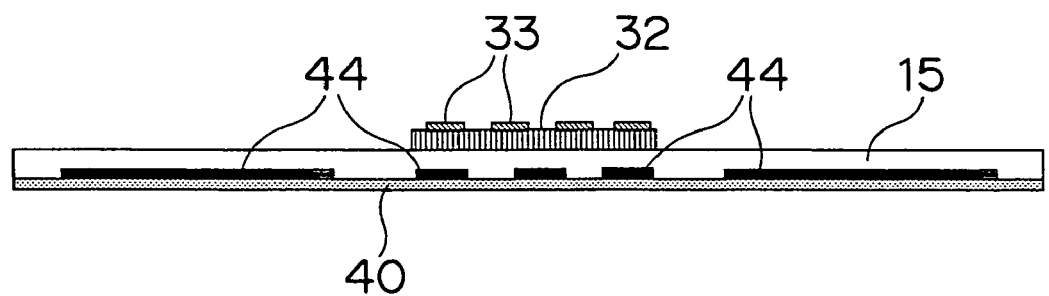
(b)
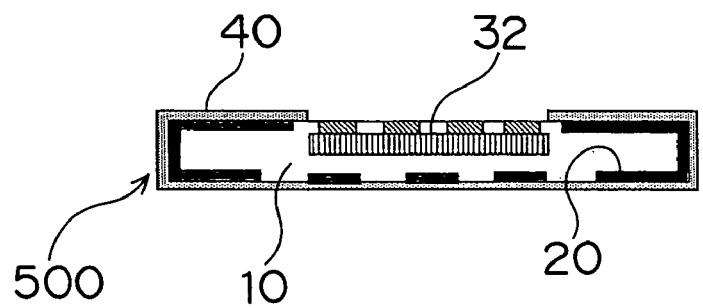
(c)
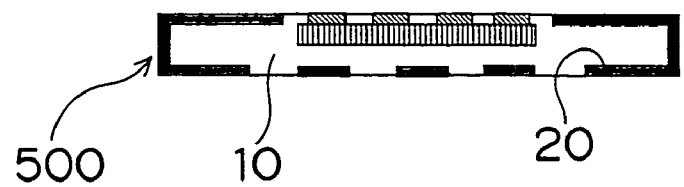

Fig.57
(a)
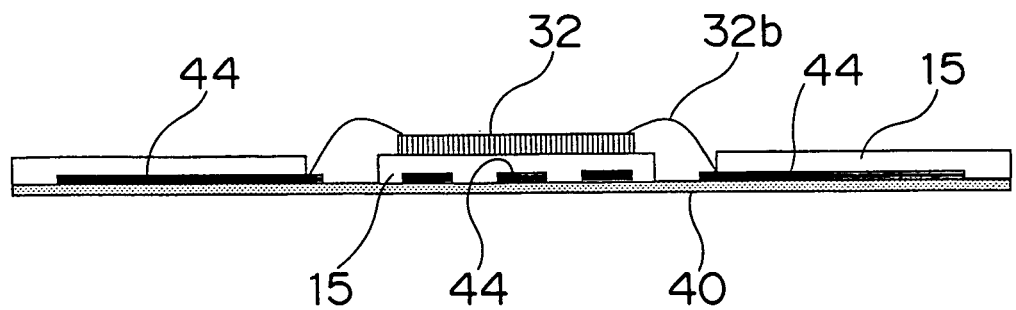
(b)
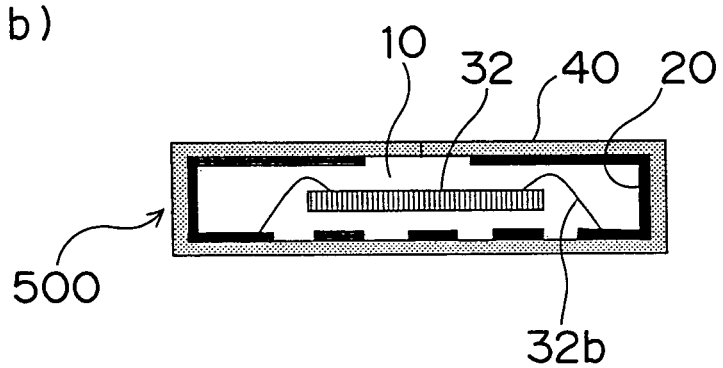
(c)
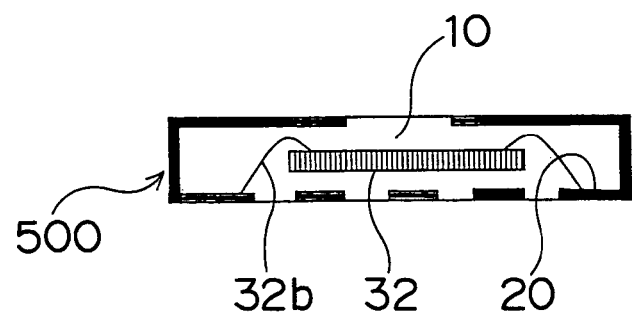

Fig.58
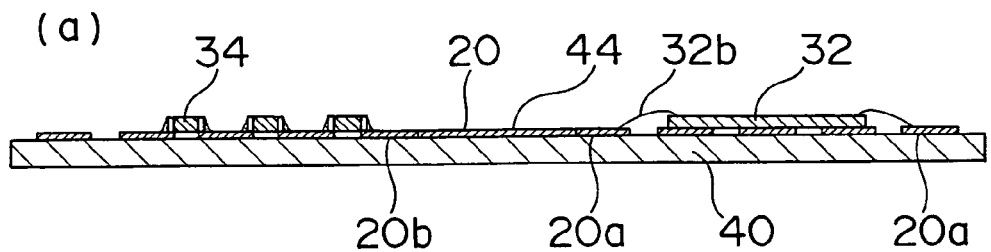
(a)
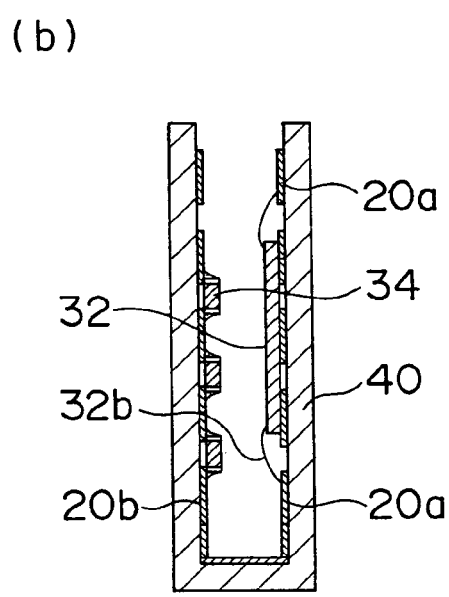
(b)
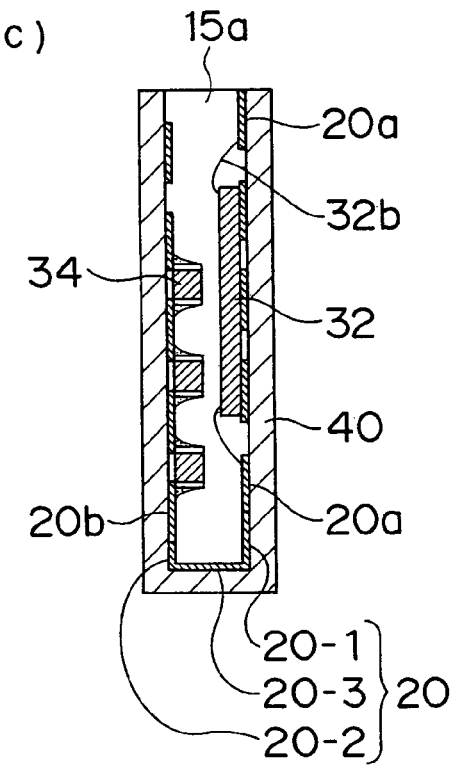
(c)
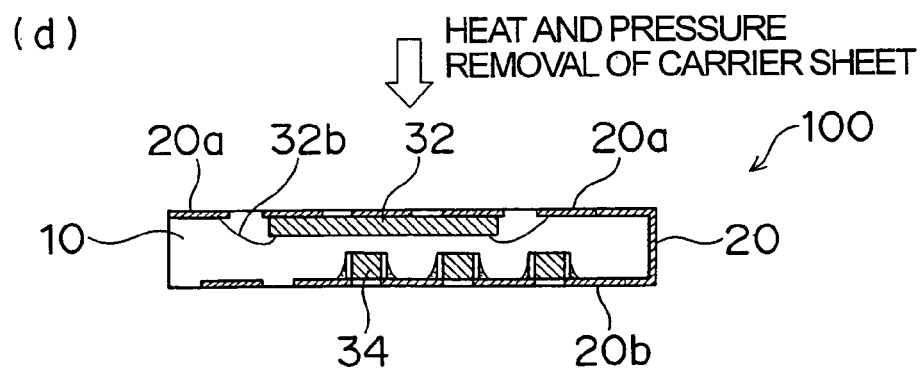
(d)

MODULE WITH A BUILT-IN COMPONENT, AND ELECTRONIC DEVICE WITH THE SAME

TECHNICAL FIELD

The present invention relates to a module with a built-in component and an electronic device with the module, such as a portable electronic device. The present invention particularly relates to a module wherein an electronic component is disposed within a substrate.

BACKGROUND OF THE INVENTION

Recently, as electronic equipment with higher performance is smaller and thinner, it is required to mount electronic components in a higher density on a printed circuit board and to more highly enhance the function of a circuit board on which the electronic components are mounted. In this situation, a module with a built-in component (or a circuit board with a built-in component), that is, a circuit board in which an electronic component is embedded has been developed (see Japanese Patent Kokai (Laid-Open)) Publication No. 11 (1999)-220262(A).

An area surface of the module with a built-in component is reduced since electronic components such as an active component (such as a semiconductor device) and a passive component (such as a capacitor), which are generally mounted on a surface of a printed board (or printed circuit board), are embedded in the substrate. An improvement in high frequency property can be achieved in the module with a built-in component by an appropriate wiring between electronic components since the freedom of positioning of the electronic components is higher compared with the surface component mounting.

In the field of a ceramic board, a LTCC (low temperature cofired ceramics) board into which an electronic component is incorporated has already practically been employed. However, there are many limitations for the LTCC board. For example, it is difficult to apply this board to a large-sized board because this board is heavy and susceptible to fracture. Further, since this board is produced through a high temperature cofire, a semiconductor device such as an LSI cannot be embedded in the board. Recently, another module with a built-in component wherein a component is disposed within a printed resin board attracts attention. The resin circuit board has no limitation on size unlike with the LTCC board, and has an advantage that LSI can be disposed within the board.

Next, the module with a built-in component (or a module with a built-in circuit component) disclosed in Japanese Patent Kokai (Laid-Open)) Publication No. 11 (1999)-220262(A) is described with reference to FIG. 1. The module with a built-in circuit component 400 consists of a substrate 401 formed by stacking insulating substrates 401a, 401b and 401, wiring patterns (or wiring layers) 402a, 402b, 402c and 402d formed on and inside the substrate 401, and circuit components 403a and 403b which are disposed within the substrate 401 and connected to the wiring patterns. The wiring patterns 402a, 402b, 402c and 402d are electrically connected through inner vias 404. The insulating substrates 401a, 401b and 401c are formed of, for example, a mixture containing an inorganic filler and a thermosetting resin.

The electrical connection of the wiring patterns 402a, 402b, 402c and 402d to each other are made by the inner vias 404 in the module with a built-in circuit component 400 as shown in Japanese Patent Kokai (Laid-Open) Publication No. 11 (1999)-220262(A). The inner via connection method is preferably employed since it enables the desired wiring patterns to be connected and the circuit components are well mounted. In the conventional component circuit boards including the module with a built-in circuit component 400 as shown in FIG. 11, the electrical conduction between an upper surface and a lower surface is ensured by the inner via or a through hole.

Based on the technical common knowledge in the field of printed wiring board and built-up wiring board, the inner via or the through hole has to be formed for producing the module with a built-in component. The via formation requires a step of forming a through hole and a step of filling the hole with a conductive paste or a step of plating the hole, which make the via forming process complicated. However, these steps are essential and it difficult to develop a more efficient production method without these steps. Further, the connection by the via requires a connection element such as a land, which increases the size of the module by the area occupied by the connection element. Further, the freedom of condition of compatibility of the electronic component incorporation and the via formation (for example, a viscosity of a resin mixture for insulating substrate) is low, whereby wire bonding may be difficult.

SUMMARY OF THE INVENTION

In this situation, the inventors, free from the conventional technical common knowledge, have carried out development of a new type of module with a built-in component which does not require a via forming step.

The present invention is made in light of the above various problems, and the primary object of the present invention is to provide a module with a built-in component which can be produced relatively efficiently and a method for producing the same. Another object of the present invention is to provide a electronic equipment which includes the module with a built-in component.

In a first aspect, the present invention provides a module with a built-in component which includes:

an insulating sheet substrate which has an upper surface and a lower surface which is opposite to the upper surface, and a side surface which connects the upper and the lower surfaces;

at least one wiring which includes i) a side-surface wiring portion which is disposed on at least a part of the side surface and ii) at least one of an upper-surface wiring portion and a lower-surface wiring portion, the upper-surface wiring portion being connected to the side-surface wiring portion each other and disposed on at least a part of the upper surface and a lower-surface wiring portion being connected to the side-surface wiring portion each other and disposed on at least a part of the lower surface; and an electronic component which is disposed within the sheet substrate.

In the module with a built-in component of the present invention, the "sheet substrate" generally has a form wherein a thickness dimension is smaller than other dimensions, and "side surface" corresponds to a surface parallel to a thickness direction and the "upper surface" and the "lower surface" correspond to surfaces vertical to the thickness direction. However, the sheet substrate may take a form wherein the thickness dimension is substantially the same as other dimensions, for example, a cube. In that case, the scope of the present invention covers a module with a built-in component wherein a wiring disposed on one surface (which is regarded as the side the surface for convenience) further extends at least one of surfaces which are parallel to each other and at right angles to the side surface, and the two surface which shall be at right angles at the side surface are regarded as the upper and the lower surfaces. The sheet substrate has a concavity in the upper surface and/or the lower surface. Further, in the case where the insulating substrate has an opening which penetrates the upper surface to the lower surface, the surfaces which define the opening are also side surfaces. Furthermore, the terms "upper" and "lower" are used to refer to the two surfaces vertical to the thickness direction, and they are not used to refer to the absolute positions when the module is used.

The module with a built-in component according to the present invention is characterized in that it has the wiring extends from the side surface of the sheet substrate to at least one of the upper surface and the lower surface of the sheet substrate. The wiring is placed on at least a part of the side surface and further extends over a part of the upper surface and/or the lower surface. In this specification, for convenience, this wiring is referred to as a "U/L-shaped side wiring" so as to distinguish this wiring from other wirings which are disposed only on the upper surface or the lower surface. A "U-shaped side wiring" has a side-surface wiring portion on the side surface and both of the upper-surface wiring portion and the lower-surface wiring portion, and bends at a right angle or into an arc at each of the border between the side surface and the upper surface and the border between the side surface and the lower surface, whereby it has an approximate "U" shape portion. An "L-shaped side wiring" has the side-surface wiring portion and either the upper-surface wiring portion or the lower-surface wiring portion, and bends at the border between the side surface and the upper surface or the lower surface at a right angle or into an arc, whereby it has an approximate "L" shape portion. Herein, these wirings are generically named as the "U/L-shaped side wiring" by using "/". In the U/L-shaped side wiring, the side-surface wiring portion ensures an electrical conduction between the upper surface and the lower surface, or an electrical conduction between the upper surface (or the lower surface) and another circuit board when the module with a built-in component is mounted on the another circuit board using the upper (or lower) surface as a mounting surface. In the module of the present invention, the U/L-shaped side wiring is generally the U-shaped side wiring, wherein a part of the U-shaped side wiring extends on the upper surface of the sheet substrate and another part of the U-shaped side wiring extends the lower surface of the sheet substrate and still another part of the U-shaped side wiring is disposed between these parts and extends on the side surface of the sheet substrate.

When the U/L-shaped side wiring is integrated with another electrical element (for example, a wiring pattern formed on the upper surface), the U/L-shaped side wiring may not be apparently distinguished from the electrical element. Also in that case, as long as the module with a built-in component includes the wiring portion which has the side-surface wiring portion and at least one of the upper-surface wiring portion and the lower-surface wiring portion, the module is included in the scope of the present invention. Further, the U/L-shaped side wiring may have a twisted or deformed "U" or "L" shape when the side-surface wiring portion extends not parallel to the thickness direction. Such U- or L-shaped side wiring is included in the U/L-shaped side wiring. The U/L-shaped side wiring may be branched, for example, on the side surface. As long as each branched wiring takes an approximate U- or L-shaped course, such a branched wiring is included in the U/L-shaped side wiring.

In one embodiment of the module with a built-in component according to the present invention, at least one of, and preferably both of the upper surface and the lower surface have, as an electrical element, at least one of a wiring pattern (or a wiring layer), an electrically connecting element, and an electronic component, and a portion of the U/L-shaped side wiring is connected to the electrical element. The portion of the U/L-shaped side wiring to be connected to the electrical element is an end portion or another portion (that is, a mid portion other than the end portions). For example, in one embodiment of the module with a built-in component, the U/L-shaped side wiring extends over the side surface of the sheet substrate and between the electrical elements on the upper surface and lower surface. That is, the electrical conduction between the electrical elements is ensured by the U/L-shaped side wiring.

In one embodiment, an electronic component disposed within the sheet substrate is electrically connected to at least one electronic element on the upper surface and/or the lower surface in a predetermined manner. In addition or alternatively, the electronic component may be electrically connected directly to a portion (for example, end portion) of the U/L-shaped side wiring. In another embodiment, the electronic component may not be electrically connected to any portion of the module, that is, the electrically component may be merely disposed within the module.

The electronic components to be disposed within the sheet substrate include, for example, an active component such as a semiconductor device, and a passive component such as a capacitor, an inductor, a resistor and a surface acoustic wave device. The number of the electronic components to be disposed within the sheet substrate is not limited to any particular one and the number and the type of the electronic components may be selected so that the module with a built-in component can function as desired.

In one preferred embodiment of the module with a built-in component according to the present invention, the U/L-shaped side wiring passes through the side surface of the sheet substrate and extends between the electrical elements on the upper surface and the electrical elements on the lower surface so as to electrically connect the electrical elements and therefore vias which penetrate from the upper surface to the lower surface do not exist. In other words, the U/L-shaped side wiring substitutes for the via. Preferably a plurality of electrical elements exist on each of the upper and the lower surfaces, and therefore a plurality of U/L-shaped side wirings which substitute for the vias preferably exist, and particularly preferably many electrical elements exist on each of the upper and lower surfaces.

A wiring pattern as the electrical element is a collection of wirings formed on the upper or the lower surface of the sheet substrate, and a part (for example, end portion) of the U/L-shaped side wiring is connected to a part of the wiring. An electrical connection element as the electrical element means an element which lies between a wiring and an electronic component for electrically connecting them, and may be, for example, a pad and a terminal. Such electrical connection element may be connected to a part of the U/L-shaped side wiring. In general, it is preferred that the wiring pattern or the electrical connection element is previously formed together with the part of the U/L-shaped side wiring integrally. For example, the U/L-shaped side wiring and the electrical element which are connected to each other may be formed together by etching a single metal layer. When the U/L-shaped side wiring and the electrical element are not formed together, they are connected using an electrical connection material (for example, an electrically conductive material such as solder, metal or a wire).

Further, the electronic components as the electrical element include an active component such as a semiconductor device, and a passive component such as the capacitor, inductor, resistor and surface acoustic wave device. A portion (for example, end portion) of the U/L-shaped side wiring is connected to a terminal of the electronic component directly or using an electrical connection material. In a preferred embodiment, a plurality of U/L-shaped side wirings are electrically connected to a plurality of terminals of the electronic component.

In the module with a built-in component of the present invention, the sheet substrate may be formed of a material containing a resin, and preferably of a composite material containing a resin and an inorganic filler. The resin may be at least one of a hardening resin (preferably a thermosetting resin) and a thermoplastic resin. In the case of the hardening resin, the resin is substantially completely cured in the finished module with a built-in component. In one embodiment, the upper surface and the lower surface of the sheet substrate has a rectangular shape which is defined by long sides and narrow sides shorter than the long sides.

In one embodiment, another module with a built-in component may be stacked on and/or under the module with a built-in component of the present invention. This another module may be the module of the present invention, or a another module of known type. Alternatively, a conventional circuit board (which does not include a built-in component) may be stacked instead of the another module with a built-in component. In another embodiment, an electronic component is mounted on at least one of the upper surface and the lower surface of the module with a built-in component.

In one embodiment of the module with a built-in component of the present invention, at least a part of the side-surface wiring portion of the U/L-shaped side wiring may sink (or dent) in the sheet substrate in a direction vertical to a thickness direction of the sheet substrate. As a result, the surface of the sunken wiring is located at a position which is concave from the side surface of the sheet substrate. The sunken wiring may constitute at least a part of the side-surface wiring portion, and preferably all parts of the side-surface wiring portion. In a more preferred embodiment, in addition to the side-surface wiring portion, the upper-surface wiring portion and the lower-surface wiring portion of the U/L-shaped side wiring sink in the sheet substrate, wherein the sunken parts are adjacent to the side-surface wiring portion or the entire of those potions. As a result, a corner portion of the U/L-shaped side wiring, which portion extends around a corner of the sheet substrate, is concave from the surface of the sheet substrate. In another embodiment, the surface of the U/L-shaped side wiring may be flush with the surface of the sheet substrate.

Therefore, in one preferred embodiment wherein at least a part of the wiring portion is concaved as described, an entire exposed surface of the side-surface wiring portion of the U/L-shaped side wiring sinks in the sheet substrate, whereby the exposed surface of the side-surface wiring portion is flush with or concave from the side surface of the substrate. In a particular preferred embodiment, the exposed surface of the U/L-shaped side wiring also becomes a bottom surface of a concave at the corner portion of the U/L-shaped side wiring (where the upper or the lower surface and the side surface of the sheet substrate intersect).

In one embodiment of the module according to the present invention, the U/L-shaped side wirings can serve as a coplanar line. The U/L-shaped side wirings serving as the coplanar line preferably sink in the side surface of the sheet substrate.

The sheet substrate may include a shield member in addition to the electronic component therein. In one example of this embodiment, the sheet substrate may include the built-in electronic components on both sides of the shield member (that is, two or more built-in electronic components which are opposed to each other with the shield member disposed therebetween). In this embodiment, each of the electronic components may be connected in a desired manner to the electrical element (for example, the wiring pattern) disposed on the upper and/or the lower surface.

In one embodiment of the module according to the present invention, a part of the electronic component disposed within the sheet substrate may be exposed in the sheet substrate. In a preferred example, a radiator (or heat releasing) member may be provided in contact with the exposed part of the electronic component.

In a second aspect, the present invention provides a method for producing a module with a built-in component (which is referred to as "a first production method" for convenience so as to being distinguished from other methods for producing a module with a built-in component as described below). The first production method includes the steps of:

(1-A) preparing a member for forming a module with a built-in component which includes a carrier sheet, a wiring pattern having at least one wiring which is disposed on the carrier sheet, and an electronic component, and an insulating layer containing a resin disposed on the wiring pattern and the electronic component (this member is referred to as a "member "A"" for convenience so as to distinguished from a member for forming a module with a built-in component used in another method for producing a module with a built-in component as described below);

(1-B) bending (or folding) the member "A" so that parts of the insulating layer face each other and portions of the at least one wiring face each other across the insulating layer and another portion of the at least one wiring extends on a side surface of the insulating layer which surface is formed by a bent part of the insulating layer; and (1-C) curing the resin contained in the insulating layer of the bent member "A".

In the step (1-B), the portions of the insulating layer preferably face each other in contact with each other. The meaning of "the parts of the insulating layer face each other" is that the parts of the insulating layer overlap. The parts of the insulating layer may overlap with a space therebetween or in contact with each other.

The step for preparing the member "A", that is, the step (1-A), may be carried out according to a method which includes the steps of:

(1-a) preparing a laminate which includes a carrier sheet and a metal layer formed thereon;

(1-b) processing the metal layer so as to form a wiring pattern having at least one wiring and optionally expose a part of the carrier sheet, the exposed part being located under a position where an electronic component is to be disposed;

(1-c) disposing the electronic component on the exposed part of the carrier sheet and/or the wiring pattern; and (1-d) forming an insulating layer containing a resin on the wiring pattern and the electronic component.

In the step (1-c), when the electronic component is disposed only on the wiring pattern and does not need to be disposed directly on the carrier sheet, it is not required to expose the carrier sheet at the position where the electronic component is disposed in the step (1-b). In that meaning, the term "optionally" is used.

Further, the electronic component and the wiring pattern may be optionally connected electrically in a predetermined manner after the step (1-c) and before the step (1-d). Such electrical connection may be eliminated when the wiring pattern and the electronic component are electrically connected as a result of the step (1-c). Furthermore, when the electronic component needs to be isolated electrically in the member "A", such electrical connection is not required.

In this production method, the formation of the insulating layer in the step (1-d) may be carried out so that the entire of the wiring pattern is covered with the insulating layer or a part of the wiring pattern is not covered with the insulating layer.

In a third aspect, the present invention provides another method for producing a module with a built-in component (which is referred to as "a second production method" for convenience so as to being distinguished from other methods for producing a module with a built-in component as described above). The second production method includes:

(2-A) preparing a member for forming a module with a built-in component which includes a carrier sheet, a wiring pattern having at least one wiring which is disposed on the carrier sheet, an insulating layer containing a resin disposed on the wiring pattern, and an electronic component disposed on the insulating layer (this member is referred to as a "member "B"" for convenience so as to being distinguished from the member "A" used in the first production method as described);

(2-B) bending (or folding) the member "B" so that parts of the insulating layer face each other and portions of the at least one wiring face each other across the insulating layer and another portion of the at least one wiring extends on a side surface of the insulating layer which surface is formed by a bent part of the insulating layer; and (2-C) curing the resin contained in the insulating layer of the bent member "B". In this method, as a result of bending, the wiring portions which face each other across the opposed parts of the insulating layer become the upper-surface wiring portion and the lower-surface wiring portion and the wiring portion that extends on the side surface of the insulating layer becomes the side-surface wiring portion in the module with a built-in component of the present invention.

In the step (2-B), the parts of the insulating layers preferably face each other in contact with each other. The meaning of "the parts of the insulating layer face each other" is that the parts of the insulating layer overlap. The parts of the insulating layer may overlap with a space therebetween or in contact with each other.

The step for preparing the member "B", that is, the step (2-A) may be carried out according to a method which includes the steps of:

(2-a) preparing a laminate which includes a carrier sheet and a metal layer formed thereon;

(2-b) processing the metal layer so as to form a wiring pattern having at least one wiring;

(2-c) forming an insulating layer containing a resin on the wiring pattern; and (2-d) disposing an electronic component on the insulating layer.

In the method for producing the member "B", the insulating layer may be formed so that the entire of the wiring pattern is covered with the insulating layer or a part of the wiring pattern is not covered with the insulating layer and exposed. When a part of the wiring pattern is not covered with the insulating layer, the electronic component may be optionally connected electrically to an exposed portion of the wiring pattern by an appropriate method, after the electronic component has been disposed.

In one embodiment, in any of the methods for producing the module with a built-in component, the step of folding (bending) the member for forming the module is carried out so that at least one wiring forms the U/L-shaped side wiring. In another embodiment, another portion (that is, a portion which is different from the portion which forms the U/L-shaped side wiring by folding) of the member is folded so that portions of another wiring of the wiring pattern (which wiring is referred to as a "wiring "s"" for convenience) face each other across the insulating layer and another portion of the wiring "s" extends on a side surface of the insulating layer which surface is formed by a bent part of the insulating layer. Next, the member is bent so that the at least one wiring forms the U/L-shaped side wiring and a portion of the wiring "s" is placed between the upper surface and the lower surface of the bent insulating layer in the thickness direction. The portion of the wiring "s" may face, for example, the U/L-shaped side wiring across the insulating layer, and particularly between the upper-surface wiring portion and the lower-surface wiring portion. The portion of the wiring "s" which is located within the insulating layer may constitute the shield member.

In the first and the second methods for producing the module with a built-in component and the methods for the members A and B, materials (for example, resin and laminate) may be of the same type. The insulating layer formed on the carrier sheet preferably contains a hardening resin, and particularly a thermosetting resin. In that case, the resin is not completely cured and preferably semi-cured when the member for producing the module with a built-in component has been produced. It is preferable that the resin is completely cured upon the production of the module with a built-in component (that is, the step (1-C) or (2-C)).

In any of the methods for producing the module with a built-in component, the facing parts of the insulating layer are substantially unified by curing the resin in the step (C), so that the sheet substrate of the module according to the present invention is obtained. Curing may be carried out by any appropriate method, for example by applying heat. In that case, the hardening resin is preferably a thermosetting resin (for example, an epoxy resin) and may contains an inorganic filler (for example, $Al_2O_3$, MgO, BN, AlN, and SiC). In the case of a thermoplastic resin, the resin may be melted or softened by heating during the formation of the insulating layer, and the bending step is carried out with the resin melted or softened, and then the resin may be cooled to be cured.

Further, in a fourth aspect, the present invention provides a method for producing a module with a built-in component (which is referred to as "a third production method" for convenience so as to be distinguished from other methods for producing a module with a built-in component as described above). The third method includes the steps of:

(3-A) preparing a member for forming a module with a built-in component which includes a carrier sheet, a wiring pattern having at least one wiring which is disposed on the carrier sheet and an electronic component (this member is referred to as a "member "C"" for convenience so as to being distinguished from the members "A" and "B" used in the first and second methods as described);

(3-B) bending the member "C" with the wiring pattern inside so that portions of the at least one wiring face each other and a space is formed between the opposed portions;

(3-C) forming a resin layer by injecting a material containing a hardening resin into the space;

(3-D) curing the resin layer so as to form an insulating layer; and (3-E) removing the carrier sheet so as to expose the wiring pattern. In this method, the U/L-shaped side wiring is formed by bending the member "C", and the insulating layer is formed by pouring the material containing the hardening resin into the space formed by bending the member "C" and then curing the resin. The member "C" may be produced by carrying out the steps (1-a) to (1-c) in the method for producing the member "A". The carrier sheet may be bent so that the at least one wiring is made a U-shape and a concave portion is formed. Alternatively, the carrier sheet may be bent into a rectangular cylinder so that the at least one wiring forms a rectangular ring (that is, two U/L-shaped side wirings are formed in a final module). Alternatively, the carrier sheet may be bent within an appropriate metal tool and the space between the wiring portions may be closed by the metal tool and the carrier sheet. When any place in the carrier sheet does not communicate with the space formed by the bending (that is, the space is completely enclosed by the carrier sheet and/or the metal tool), a hole for injecting the resin is formed in the carrier sheet or the metal tool and the resin is poured through the hole. By selecting an appropriate folding manner, the U/L-shaped side wirings can be disposed on two or more side surfaces (for example, all of four side surfaces) of a hexahedron.

The module with a built-in component of the present invention may be used in any appropriate electronic equipment, for example a portable electronic device. In that case, the electronic equipment has a module with a built-in component of the present invention, and a casing for housing the module. Thus, in a fifth aspect of the present invention provides the electronic equipment which includes the module with a built-in component of the present invention.

In the module with a built-in component of the present invention, there is no need to form a via since the module of the present invention has an insulating sheet substrate, an electronic component disposed within the insulating substrate and a U/L-shaped side wiring which extends from the upper surface to the lower surface through the side surface of the sheet substrate or extends from the upper or the lower surface and terminates on the side surface of the sheet substrate. Therefore, the present invention provides the module with a built-in component which is more efficiently produced than the conventional module with a built-in component.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 8(a) to 8(c) are sectional views which schematically show the steps in a method for producing a module with a built-in component 200;

FIGS. 56(a) to 56(c) are sectional views which schematically show the steps in a second method for producing a module with a built-in component of the present invention;

FIGS. 57(a) to 57(c) are sectional views which schematically show the steps in a second method for producing a module with a built-in component of the present invention; and FIGS. 58(a) to 58(c) are sectional views which schematically show the steps in a third method for producing a module with a built-in component of the present invention.

DETAILED DESCRIPTION OF THE PREFERRED EMBODIMENTS

Figure 1:
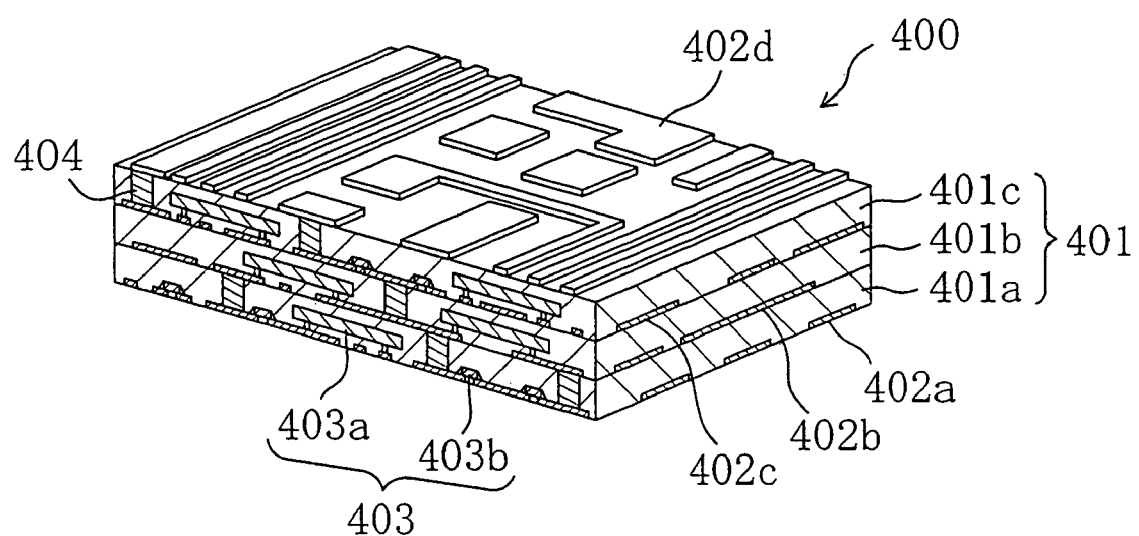
FIG. 1 is a perspective view of a module with a built-in component 400 from the prior art.

Embodiments of the present invention are described with reference to the attached drawings. In the drawings, elements which have substantially the same function are denoted by the same reference numeral in principle. It should be noted that the present invention is not limited by the embodiments described below.

Embodiment 1

Figure 2:
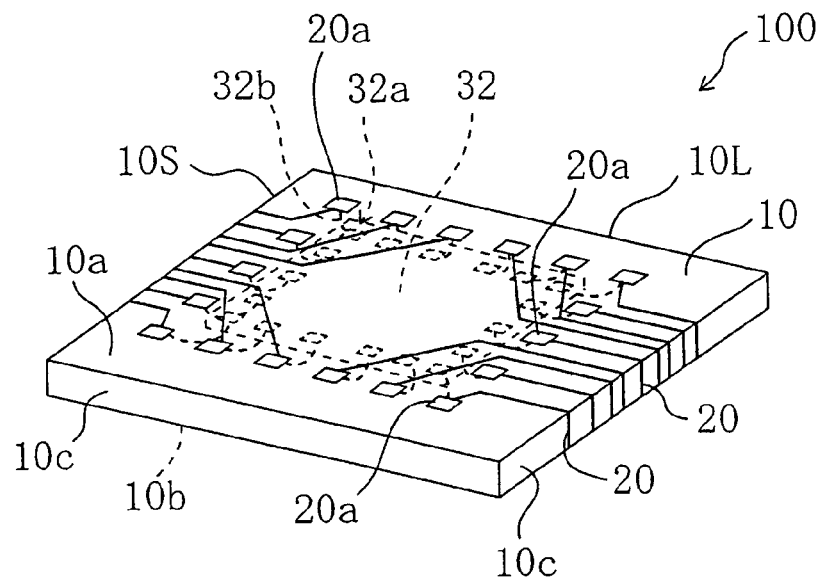
FIG. 2 is a perspective view schematically showing a module with a built-in component 100 in accordance with a first embodiment of the present invention.

A module with a built-in component of the first embodiment is described with reference to FIGS. 2 and 3. FIG. 2 is a perspective view which schematically shows a construction of the module with a built-in component 100 of this embodiment and FIG. 3 is a cross-sectional view which schematically shows the module with a built-in component 100 which is shown in FIG. 2.

Figure 3:
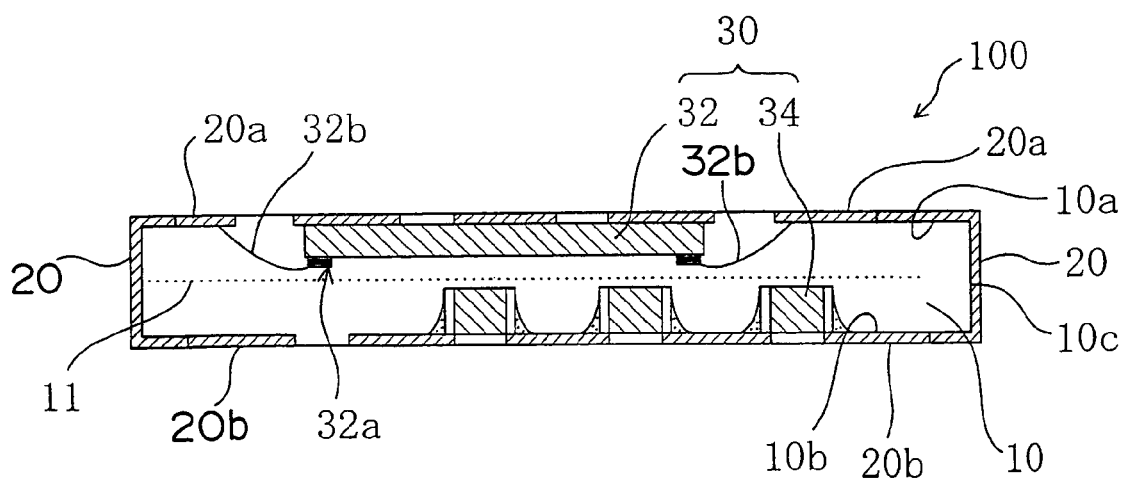
FIG. 3 is a perspective view schematically showing a module with a built-in component 100 in accordance with the first embodiment of the present invention.

The module with a built-in component 100 as shown in FIGS. 2 and 3 has a sheet substrate 10, electronic components 30 (32, 34) disposed within the sheet substrate 10, and a plurality of U/L-shaped side wirings 20 (U-shaped side wirings in the illustrated embodiment). The sheet substrate 10 includes an upper surface 10a, a lower surface 10b which is opposed to the upper surface and a side surface 10c which connects the upper surface 10a and the lower surface 10b. One end of the U/L-shaped side wiring is connected to an electrical element 20a (for example, a terminal such as a land) disposed on the upper surface 10a. The U/L-shaped side wirings extending from the electrical elements 20a pass through the side surface 10c of the sheet substrate 10 and reach to the lower surface 10b. The other end of the U/L-shaped side wiring 20 is connected to an electrical element 20b (for example, a terminal such as a land) disposed on the lower surface 10b of the sheet substrate 10. In the illustrated embodiment, at least one of the U/L-shaped side wirings 20 is connected to the electronic component 32 via the electrical element 20a and a lead 32b (or a metal thin wire). In another embodiment, the U/L-shaped side wiring 20 may be electrically connected directly to the electronic component 30 (32, 34) only through the lead 32b (or the metal thin wire) or only through the electrical element 20a.

In the embodiment shown in FIGS. 2 and 3, a semiconductor device (for example, a bare chip) as the electronic component 32 is disposed within the sheet substrate 10 on the upper side, and chip parts (such as a chip resistor, a chip inductor, and a chip capacitor) as the electronic components 34 are disposed within the sheet substrate 10 on the lower side. Terminals 32a (device terminals) are provided in the semiconductor device 32 and connected to the lands 20a with the metal thin wires 32b by wire bonding. The chip parts 32 are mounted on a wiring pattern (a wiring pattern including lands 20b) on the lower surface 10b of the sheet substrate 10 with, for example, solder.

In this embodiment, the U/L-shaped side wirings 20 are connected to the lands 20a and 20b on both ends. The lands 20a and 20b are the terminals for connecting this module to another circuit board or a semiconductor chip. In that sense, the electrical element denoted by the reference numerals 20a or 20b may be referred to as a "terminal." It is preferable that the U/L-shaped side wiring are previously formed together with the lands 20a and 20b integrally. The upper surface 10a (and the lower surface 10b) of the sheet substrate 10 is substantially flat and has a rectangular shape. The sheet substrate 10 may be preferably formed by folding an insulating layer containing a semi-cured resin followed by curing the insulating layer into a completed cured condition. A detailed description of the formation of the sheet substrate will be given in the following. For illustrating this, the overlapped face which is created by folding (that is, a plane which is defined (or sandwiched) by portions of the insulating layer which are opposed to each other in contact) is shown as a dotted line 11. In actuallity, the overlapped face as the dotted line 11 does not exist in the final product since the resin contained in the insulating layer is softened or melted to form an integrated body before it is completely cured.

In the module with a built-in component 100 of this embodiment, the electrical conduction between the upper surface 10a and the lower surface 10b of the sheet substrate 10 is made by the U/L-shaped side wiring 20. A via is not formed for electrically connecting the upper surface 10a and the lower surface 10b since the U/L-shaped side wirings 20 serve to electrically connect the upper surface 10a and the lower surface 10b. In other words, a via, which is essential in the conventional module with a built-in component, is not required in the module 100 in accordance with this embodiment.

In the specification, the term "via" is used as a generic term which refers to both of "inner via" and "through hole." Although the terms "via" and "through hole" are generally used without being distinctly distinguished from each other, the term "via" means a through bore which connects wiring patterns and which is generally formed for connecting the wiring patterns on both sides of an insulating layer of a multilayer board. The term "through hole" generally means a through drilling for electrically connecting a wiring pattern on the upper surface and a wiring pattern on the lower surface. Herein, the term "via" means a bore which passes through the sheet substrate and serves to give an electrical conduction. The bore may be filled with a conductive material or covered with a thin film of the conductive material.

The module with a built-in component 100 may be an organic board with a built-in component which includes an insulating substrate formed of an organic material such as a resin. In one embodiment, the sheet substrate 10 may be formed of a composite material containing a resin (for example, a thermosetting resin and/or a thermoplastic resin) and an inorganic filler. The resin is preferably a thermosetting resin. The sheet substrate 10 may be formed of only the thermosetting resin without using the inorganic filler. The thermosetting resin may be, for example, an epoxy resin. When the inorganic filler is added, a filler of $Al_2O_3$, $SiO_2$, MgO, BN or AlN may be used. The addition of the inorganic filler enables various property of the sheet substrate 10 to be controlled. For this reason, the sheet substrate 10 is preferably formed of the composite material containing the inorganic filler.

The U/L-shaped side wiring 20 may be formed of, for example, a copper foil, and its thickness may be, for example, in a range of about 3 μm to about 50 μm. The number of the U/L-shaped side wirings 20 is, for example, eight or more. In the configuration shown in FIG. 2, eighteen U/L-shaped side wirings 20 are provided. In the illustrated configuration, the terminals 20a and 20b and the U/L-shaped side wirings 20 may be monolithically formed of the copper foil at the same time. Further, in the illustrated module, U/L-shaped side wirings that are not connected to the terminals 20a and 20b may be additionally formed as dummy wirings.

The dummy wiring serves to even a wiring density. The dummy wiring is also used for a test. Further, matching between the module 100 and a printed board on which the module 100 is to be mounted can be examined by the dummy wiring. Furthermore, a constant (for example, a characteristic impedance) of the module with a built-in component or the printed board may be adjusted by disposing a test component (or a circuit constant adjustment component) on the dummy wiring. The test component may be, for example, a chip part (a chip inductor, a chip resistor and a chip capacitor). The test component may be removed at the final stage, or may remain on the module.

A maximum number of the U/L-shaped side wirings 20 depends on the number of the terminals of the electronic component 32 such as a semiconductor chip and the size of the module with a built-in component 100. Further, the maximum number of the U/L-shaped side wirings is determined considering a line width and spacing (line-space; L/S) of the U/L-shaped side wiring 20. For example, the maximum number of the U/L-shaped side wirings 20 may be about 500 in a module having a predetermined size that is accommodated to a general mounting area. Of course, more or less than five hundred U/L-shaped side wirings 20 may be provided.

In the configuration shown in FIG. 2, the terminals (lands) 20a are the electrical elements which are connected to the U/L-shaped side wirings 20 and they are arranged at a peripheral region on the upper surface 10a of the sheet substrate 10. In other words, the terminals 20a (lands) to which one ends of the U/L-shaped side wirings 20 are connected are arranged in a peripheral arrangement which corresponds to the arrangement of the terminals 32a of the electronic component 32 (such as the bare chip) which is disposed beneath the upper surface 10a of the sheet substrate 10. The arrangement of the terminals 20b to which the other ends of the U/L-shaped side wirings 20 on the lower surface 10b of the sheet substrate 10 are connected may be determined so that it corresponds to the position of the chip parts 34 or a terminal arrangement of a printed board (such as a mother board) to which the module 100 is mounted. For example, the terminals 20b may be arranged in a form of lattice on the lower surface 10b of the sheet substrate 10. Specifically, the terminals 20b may be lands which forms a land grid array (LGA), or solder balls may be disposed on the terminals so as to form a ball grid array (BGA).

The size of the module with a built-in component 100 is not limited to a particular size and it depends on the size and the number of the electronic components 30 which are embedded in the module 100, the size of the printed board on which the module 100 is mounted, and the number and the line-space (L/S) of the wirings in the module 100. In one example, the area of the upper surface of the sheet substrate 10 is 200 mm$^2$ or less.

The sheet substrate 10 of the module with a built-in component 100 of this embodiment has an approximate hexahedral shape (which is generally a rectangular parallelepiped whose thickness direction is considerably smaller than other dimensions) and the upper and the lower surface 10a and 10b of the sheet substrate 10 has an approximate rectangular shape. Herein the "approximate hexahedral shape and approximate rectangular shape" may include, in addition to a geometrical hexahedron and rectangle, a hexahedron and a rectangle whose corners or sides are rounded and those whose surfaces are not completely flat but curved. In the construction shown in FIG. 2, when a region around the sides of the sheet substrate 10 is not sharpened but round (that is, the corner of the sheet substrate 10 is planed off), an effect of reducing break of the U/L-shaped side wirings 20 is obtained.

In the embodiment shown in FIG. 2, the upper surface 10a of the sheet substrate 10 has an approximate rectangle having a long side 10L and a narrow side 10S. The length of the long side 10L is, for example, equal to or less than thee times the length of the narrow side 10S. In the constitution of this embodiment, the width of the side-surface portion of the U/L-shaped side wiring 20 may be 0.25 mm or less and the space between the side-surface portions of the U/L-shaped side wirings 20 may be 0.3 mm or less. The thickness of the sheet substrate 10 may be, for example, in a range of about 0.1 mm to about 2 mm.

In the case where the vias are formed in a module with a built-in component, the effectively largest number of the vias are arranged in a square substrate. In other words, the number of the vias in a rectangular or an oval substrate is not as much as that in the square. On the other hand, many U/L-shaped side wirings 20 can be effectively provided not only in the square substrate but also in the rectangular substrate (for example, a rectangle whose long side 10L has a length equal to or more than 1.4 times the length of the narrow side 10S) of the module with a built-in component 100 of this embodiment since the U/L-shaped side wiring 20 can be arranged by determining the line-space (L/S) of the U/L-shaped side wirings 20. In the embodiment shown in FIG. 2, the U/L-shaped side wirings 20 are formed in two side surfaces 10c of the hexagonal sheet substrate 10. However, the surfaces and positions where the U/L-shaped side wirings 20 extend, and the length of each U/L-shaped side wiring 20, are not limited to those shown in FIG. 2. For example, when more U/L-shaped side wirings 20 are provided, they may be formed on every side surface 10c.

Figure 4:
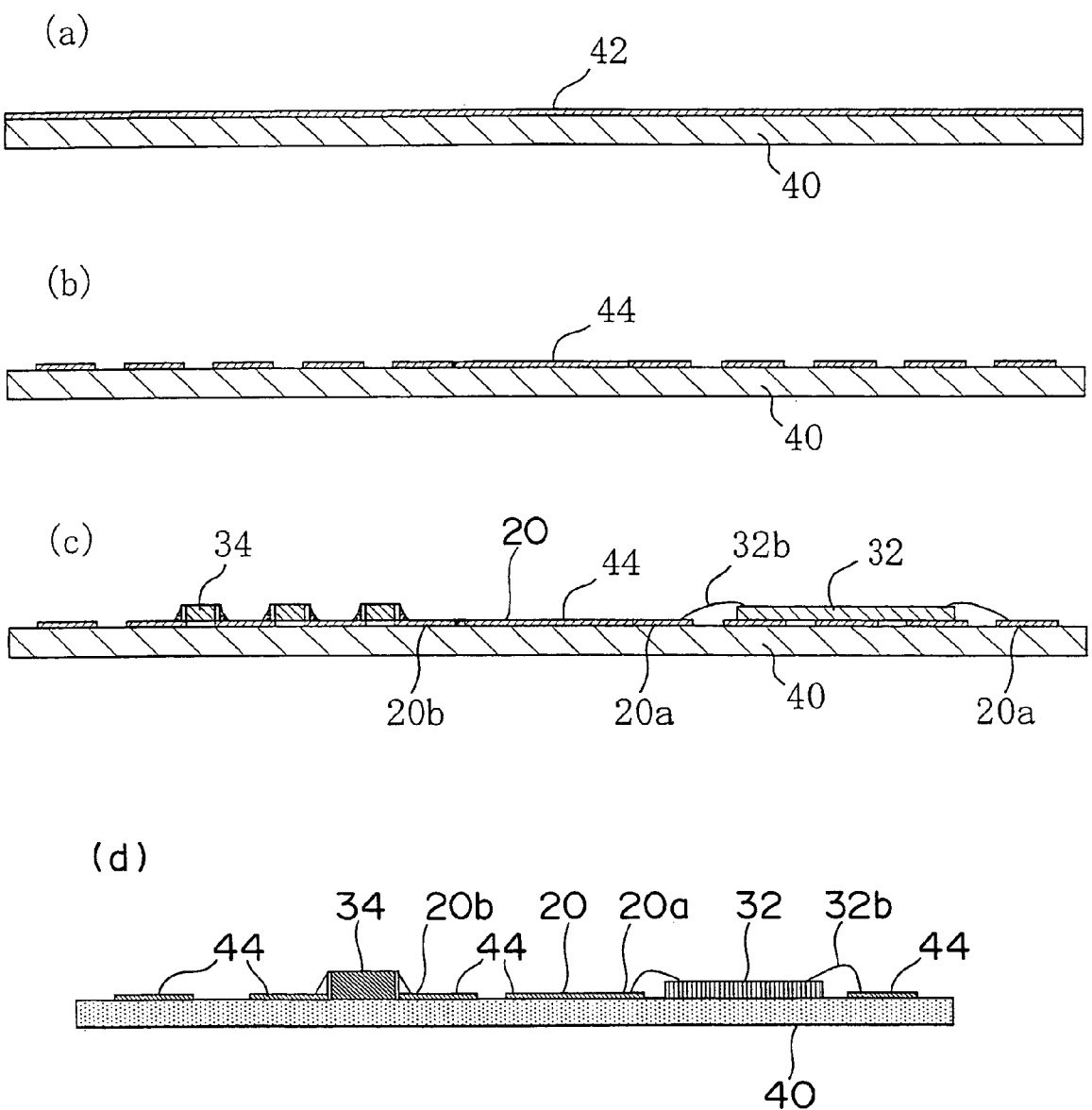
FIGS. 4(a) to 4(d) are sectional views which schematically show the steps in a method for producing a member for forming a module with a built-in component.
Figure 5:
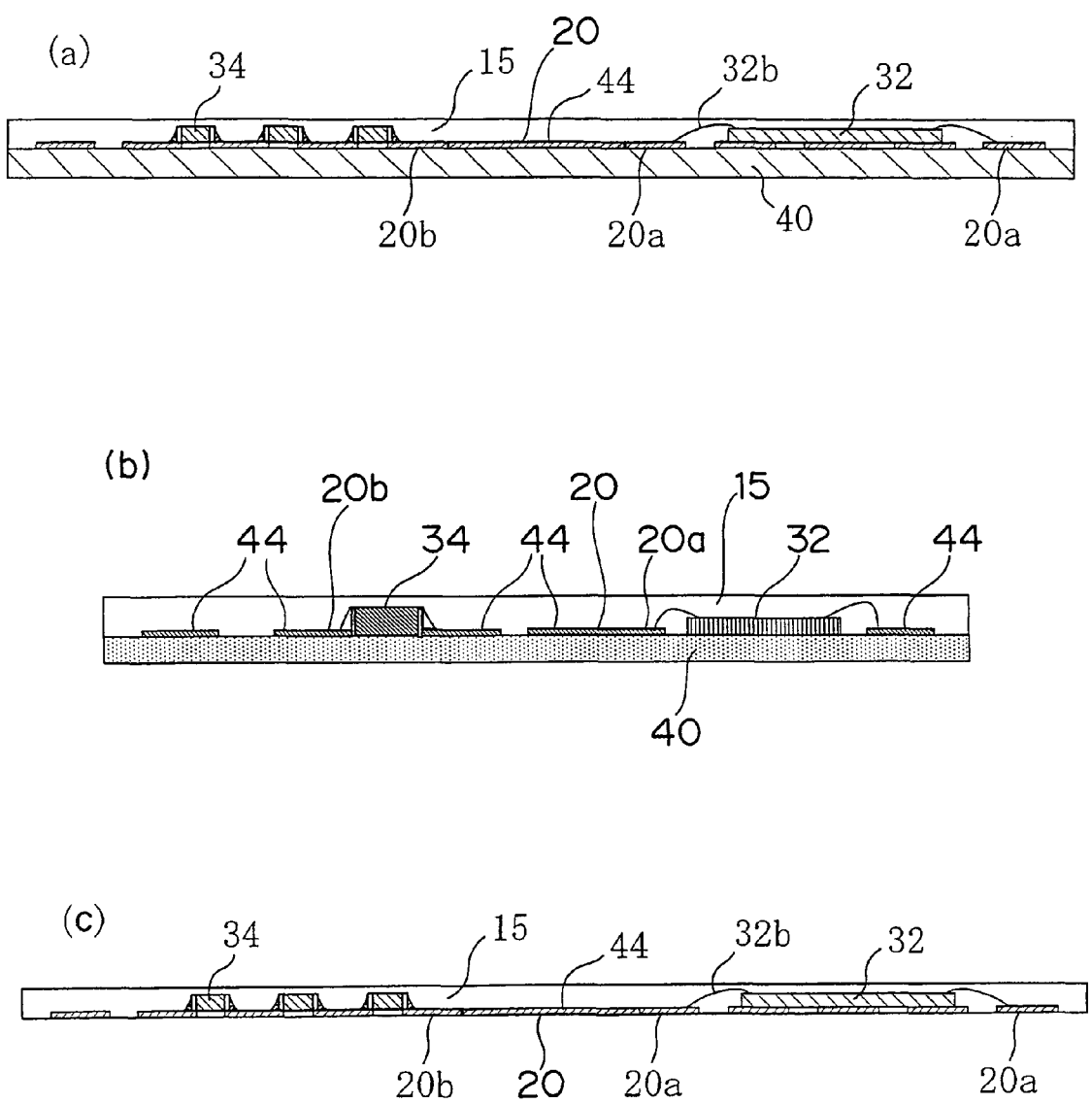
FIGS. 5(a) to 5(c) are sectional views which schematically show the steps in a method for producing a member for forming a module with a built-in component.
Figure 6:
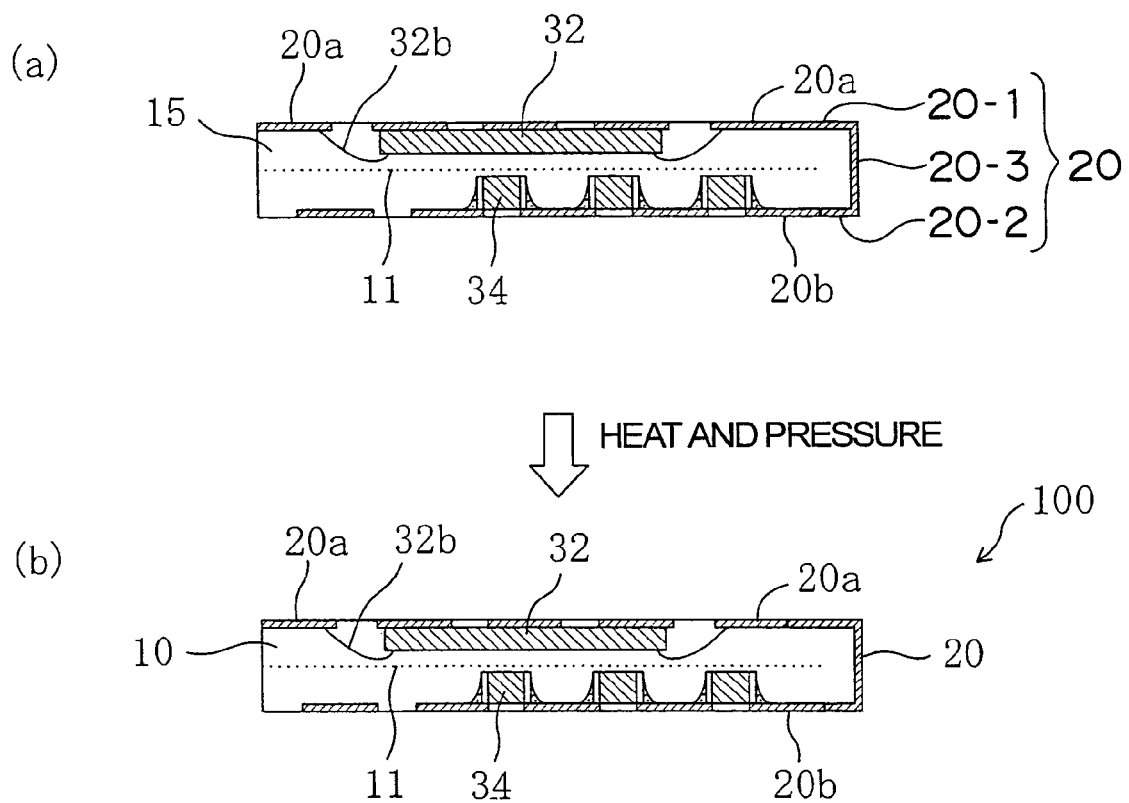
FIGS. 6(a) and 6(b) are sectional views which schematically show the steps in a first method for producing a module with a built-in component of the present invention.

Next, one embodiment of a method for producing the module with a built-in component 100 as shown in FIGS. 2 and 3 is described with reference to FIGS. 4 to 6. FIGS. 4 to 6 are schematic cross-sectional views similarly to FIG. 3.

FIGS. 4(a) to 4(d) and FIGS. 5(a) to 5(c) show steps of producing a sheet 15 containing a semi-cured resin which is a member "A" for forming a module with a built-in component. As described above, the member A includes a carrier sheet, a wiring pattern having at least one wiring (which is to be a U/L-shaped side wiring) which pattern is formed on the carrier sheet and an electronic component, and an insulating layer containing a hardening resin which layer is formed on the wiring pattern and the electronic component. The electronic component may be disposed directly on the wiring pattern (see FIG. 4(c)) or may be directly on the carrier sheet which is exposed by removing a metal foil (see FIG. 4(d)).

The member "A" may be prepared by a method which includes the steps of:

(1-a) preparing a laminate 41 including a carrier sheet 40 and a metal layer 42 formed thereon;

(1-b) processing the metal layer 42 so as to form a wiring pattern 44 having at least one wiring and optionally to expose a portion of the carrier sheet, the exposed portion being located under a position where an electronic component 32 it to be situated;

(1-c) disposing the electronic component 32 on the exposed portion of the carrier sheet and/or the wiring pattern;

(1-d) forming an insulating layer 15 containing a hardening resin on the wiring pattern 44 and the electronic component 32.

As shown in FIG. 4(c), in the case where the electronic component 32 is disposed in a predetermined manner only on the wiring pattern 44 (that is, the electronic component 32 does not need to be disposed directly in contact with the carrier sheet), there is no need to expose a portion of the carrier sheet 40 which is beneath the position where the electronic component 32 is to be disposed. As shown in FIG. 4(d), in the case where the electronic component 32 is directly on the carrier sheet 40, the portion of the carrier sheet 40 corresponding to the position of the electronic component 32 is exposed. Of course, the carrier sheet 40 is exposed in the portions where the wiring is not situated as a result of the formation of the wiring pattern.

Further, as shown in FIGS. 4(c) and 4(d), the electronic component 32 may be optionally connected electrically in a predetermined manner, by using, for example, a metal thin wire after the step (1-c) and before the step (1-d). This electrical connection may be omitted when the wiring pattern and the electronic component are electrically connected by disposing the electronic component in the step (c), or when the electrical connection between the wiring pattern and the electronic component is not necessary.

Firstly, the step (1-a) of preparing the laminate is carried out, as shown in FIG. 4(a), by preparing a carrier sheet 40 which has a metal layer 42 formed on one surface thereof. The metal layer 42 may be formed of, for example, a copper foil, and the carrier sheet 40 may be formed of, for example, a metal foil (for example, a copper foil or an aluminum foil) or a resin sheet. The thicknesses of the metal layer 42 and the carrier sheet 40 may be, for example, in a range of about 3 μm to about 50 μm and in a range of about 25 μm to about 200 μm respectively. Various laminates suitable for this laminate are known for producing a circuit board.

Next, the step (1-b) of processing the metal layer 42 of the laminate may be carried out by any appropriate method. As shown in FIG. 4(b), a patterning step is known as a step for forming the predetermined wiring pattern 44 and a step for exposing the carrier sheet by removal of a portion of the metal layer which portion corresponds to the position where the electronic component 32 is disposed. This step may be carried out by, for example, an etching process wherein a mask is used.

Next, the electronic component is disposed in the step (1-c). In one embodiment, the electronic components 32 and 34 may be disposed on the wiring pattern 44 as shown in FIG. 4(c). In another embodiment, the electronic components 32 and 34 may be disposed directly on the exposed portion of the carrier sheet 40. In any embodiment, the electronic components 32 and 34 may be mounted so that they are electrically connected to the wiring pattern 44, if necessary. In the illustrated embodiment, the lands 20a which are formed on one ends of wirings 20 that are to form the U/L-shaped side wirings in the module and the terminals (not shown) of the electronic component 32 (for example, a semiconductor device (bare chip)) are connected by wire bonding with use of a metal thin wire 32. Other electronic components 34 (such as chip parts) are connected to lands 20b which are formed on the other ends of the wirings 20 that are to form the U/L-shaped side wirings, and thereby electrically connected to the wiring pattern 44. The chip parts 34 may be mounted by soldering.

Next, in the step (1-d), the insulating layer is formed. As shown in FIGS. 5(a) and 5(b), the insulating layer 15 is formed by applying a resin on the carrier sheet 40 so that the resin covers the electronic components 32 and 34 and the wiring pattern 44. The resin employed herein is an electrically insulating thermosetting resin and/or thermoplastic resin. It is preferable to use a semi-cured hardening resin, particularly the semi-cured thermosetting resin. The resin may contain a filler as described above. The thickness of the insulating layer 15 may be, for example, in a rage of about 50 μm to about 100 μm.

For example, a composite material containing a thermosetting resin in a B-stage state and an inorganic filler may be applied to the carrier sheet 40. In one embodiment, the composite material may contain at least 100 parts by weight (preferably 140 to 180 parts by weight) of the inorganic filler to 100 parts by weight of the thermosetting resin. The "B-stage state" means a state wherein a hardening reaction stops at the middle stage. The resin in the B-stage state is once softened (or melted) and then completely hardened by further being heated. The completely hardened state is referred to as a "C-stage."

Addition of $Al_2O_3$, BN or AlN as the inorganic filler may improve a thermal conductivity of the module with a built-in component. Further, it is possible to adjust the thermal expansion coefficient by selecting an appropriate inorganic filler. The resin component has a relatively large thermal expansion coefficient. Addition of $SiO_2$ or AlN can reduce the thermal expansion coefficient of the insulating layer (the sheet substrate of the module with a built-in component). Alternatively, addition of MgO may improve the thermal conductivity and increase the thermal expansion coefficient of the insulating layer. The addition of $SiO_2$ (particularly an amorphous $SiO_2$) can reduce a dielectric constant of the insulating layer as well as the thermal expansion coefficient.

The member "A" can be obtained after forming the insulating layer as described above. After the step (1-d), the carrier sheet remains in the member "A" and the member "A" with the carrier sheet can be used in the step (1-A) of the first method for producing the module with a built-in component.

The module with a built-in component may be produced using the member "A" in accordance with the first production method which includes the steps of:

(1-B) bending the member "A" so that parts of the insulating layers are opposed to and contact with each other and portions of the at least one wiring of the wiring pattern an upper-surface wiring portion and a lower-surface wiring portion which are opposed to each other across the opposed parts of the insulating layer and another portion of the at least one wiring extends as a side-surface wiring portion on a side surface of the opposed parts of the insulating layer; and (1-C) curing the resin contained in the insulating layer of the bent member "A".

When carrying out the step (1-B), before bending the member "A", the carrier sheet 40 may be removed as shown in FIG. 5(c), and thereby the insulating layer 15 with the wiring pattern formed thereon can be obtained in a form of sheet. In this sheet 15, the wiring pattern 44 is exposed on the surface, and the electronic components 32 and 34 are buried therein. In the case where the electronic component is disposed, as shown in FIG. 4(d), directly on the carrier sheet in the production process of the member "A", a lower surface of the electronic component 32 is exposed.

In the step (1-B), a construction as shown in FIG. 6(a) is obtained by, for example, folding the sheet 15 (in the illustrated embodiment, the sheet 15 is folded in half). That is, the insulating layer 15 is folded such that the parts thereof are opposed to and contacts with each other on a plane indicated by the dotted line 11 and the portions 20-1 and 20-2 of the at least one wiring 20 become the upper-surface wiring portion and the lower-surface wiring portion which face each other across the insulating layer 15 and the other portion 20-3 of the at least one wiring 20 becomes the side-surface wiring portion which extends on the side surface of the folded insulating layer 15. Therefore, the wiring 20 consisting of the upper-surface wiring portion 20-1, the lower-surface wiring portion 20-2 and the side-surface wiring portion 20-3 constitutes at least one wiring which extends from the upper surface to the lower surface of the insulating layer 15 through the side surface of the insulating layer 15, that is, the U/L-shaped side wiring. The constitution as shown in FIG. 6(a) is substantially the same as the constitution of the module 100 shown in FIG. 3 except that a U/L-shaped side wiring does not exist on the left side of the insulating layer 15 in the drawing and the portions of the insulating layer 15 are overlapped. For obtaining the construction shown in FIG. 3, for example, it is necessary to locate the wirings which are to be the U/L-shaped side wiring at two positions and then to fold the member "A" at the positions (see FIG. 8). It can be said that FIG. 6(a) also shows a cross section of the module with a built-in component as shown in FIG. 2, which is taken along a line where the U/L-shaped side wiring does not exist on one side.

Next, the structure shown in FIG. 6(a) is heated and pressurized so that it is completely cured, whereby the overlapped portions of the insulating layer become one sheet substrate 10 as shown in FIG. 6(b) and the sheet substrate becomes the module with a built-in component 100 of the present invention. In a state as shown in FIG. 6(b), the sheet substrate 10 is completely hardened into the C-stage state. When the resin is thermoplastic, it becomes a hardened state by cooling after heating and pressurizing. In FIG. 6(b), the contact plane 11 of the insulating layer is indicated, although the plane may not exist distinctly after curing.

As described above, the carrier sheet 40 may be removed before folding the member for forming the module as shown in FIG. 5(c). Alternatively, the carrier sheet 40 may be removed after folding the member and before curing. Alternatively, the carrier sheet 40 may be removed after the module with a built-in component has been completed, for example, after the resin has been cured or before the module with a built-in component is mounted.

In FIG. 6(a), the overlapped plane which is created by folding the sheet 15 is shown by the dotted line for better understanding. After heating and pressurizing, the sheet 15 is unified to become the sheet substrate 10 and therefore the overlapped plane 11 may often disappear. However it may remain.

Next, a second method for producing a module with a built-in component is described. The second production method differs from the first production method in that the member for forming the module with a built-in component is a member "B". Except for the member "B", the second production method may be the same as the first production method.

A method for producing the member "B" is described with reference to FIGS. 56 and 57. In this production method, the steps of:

(2-a) preparing a laminate including a carrier sheet 40 and a metal layer formed thereon; and (2-b) processing the metal layer so as to form a wiring pattern 44 having at least one wiring are carried out similarly to the method for producing the member "A".

Thereafter, the steps of:

(2-c) forming an insulating layer 15 containing a resin on the wiring pattern 44, and preferably an insulating layer containing a hardening resin (particularly a thermosetting resin); and (2-d) disposing an electronic component 32 on the insulating layer 15 are carried out.

In this method, the insulating layer 15 is previously formed and the electronic component 32 is disposed on the insulating layer, differently from the production method of the member "A." The insulating layer may be formed so that the entire of the wiring pattern 44 is covered with the insulating layer (see FIG. 56(a)). Alternatively, the insulating layer may be formed so that a portion of the wiring pattern 44 is exposed and the other portion of the wiring pattern is covered with the insulating layer (see FIG. 57(a)). When the portion of the wiring pattern is exposed, the exposed portion and the electronic component 32 are optionally connected electrically in a predetermined manner with, for example, a metal thin wire 32. The member "B" obtained by this method is subjected to the steps (2-B) and (2-C) similarly to the steps (1-B) and (1-C) of the first production method and thereby a module with a built-in component 500 is obtained. Specifically, the member "B" is folded and the insulating layer is hardened.

FIG. 56(a) shows a schematic cross-sectional view of the member "B" wherein the insulating layer 15 is formed so as to cover the entire wiring pattern 44 formed on the carrier sheet 40 and the electronic component 32 with terminals 33 is disposed on the insulating layer. This member is folded in the step (2-A), as shown in FIG. 56(b), so that at least one wiring constituting the wiring pattern 44 forms the U/L-shaped side wiring 20, and then the member is heated and pressurized in the step (2-B) so that the module with a built-in component is obtained. The module with a built-in component may be produced by an alternative method which includes removing the carrier sheet 40 from the member "B" that is shown in FIG. 56(a) and then folding the member "B" and curing the member "B" as shown in FIG. 56(c). In another embodiment, the member "B" with the carrier sheet 40 as shown in FIG. 56(a) may be folded into a constitution as shown in FIG. 56(b) and then cured, and the carrier sheet 40 is subsequently removed, whereby the module with a built-in component is obtained. Alternatively, the carrier sheet may remain until the module is used.

It would be easily understood that an exposed surface (the upper surface in FIGS. 56 and 57) of the electronic component in the member "B" may be exposed on either the upper surfaces or the lower surfaces of the module with a built-in component (on the upper surface in FIG. 56) or may be completely buried in the module as shown in FIG. 57 by adjusting the overlapping degree of the portions of the insulating layer which are opposed to and contact with each other. Further, a material of the insulating layer may optionally fill the region among the terminals 33 by adjusting the overlapping degree of the portions of the insulating layer and/or the conditions of heating and pressurizing (see FIG. 56(a)).

Further, a third method for producing a module with a built-in component is described with reference to FIG. 58. In the third production method, the steps (1-a) to (1-c) of the production method of the member "A" are carried out so that a member "C" for forming the module with a built-in component as shown in FIG. 58(a) is obtained (the step (3-A)). Next, the member "C" is bent with the wiring pattern 44 inside so that the portion which is to be the U/L-shaped side wiring 20 forms an approximate "U" shape as shown in FIG. 58(b) (the step (3-B)). Next, a material containing a hardening resin is injected into a concavity formed by bending (the step (3-C)). A material filled in the concavity may be selected from the materials which are exemplified in the above as the material for the insulating sheet substrate and it is preferably a composite material containing a thermosetting resin and an inorganic filler. The hardening resin contained in the material is cured by heating and pressurizing (the step (3-D)) and then the wiring layer is exposed by removing the carrier sheet 40 (the step (3-E)), whereby the module with a built-in component 100 of the present invention as shown in FIG. 58(d) is obtained.

By producing the module with a built-in component according to any of the methods described above, the sheet substrate 10 which has the U/L-shaped side wiring 20 and the built-in electronic components 32 and 24 can be obtained. Since the electrical conduction between the upper surface 10a and the lower surface 10b of the sheet substrate 10 may be ensured by the U/L-shaped side wiring 20, it is not necessary to form the vias in the sheet substrate 10 and therefore the steps of forming the vias can be omitted.

As described above, the vias do not need to be formed in the module with a built-in component of the present invention, which eliminates a limitation to the material of the sheet substrate which limitation is involved in a via processing with a punch or laser. Therefore, it is possible to mix a filler which hardly absorbs the laser beam (such as a glass or a silica) into a material for the sheet substrate (that is a material for the insulating layer). As a result, such a filler can be used to adjust the property (such as a thermal conductivity and a thermal expansion coefficient) of the material for the sheet substrate. Further, the via connection with a conductive paste generally requires optimization of a viscosity of the material for the insulating layer so as to stabilize the via shape, which tends to create a void upon disposing the electronic component within the sheet substrate. On the contrary, in the module of the present invention, a soft resin can be used for the sheet substrate which resin is suitable for disposing the electronic component within the sheet substrate, which suppresses the void formation. In addition, a mounting method such as a wire bonding method can be relatively freely selected because the limitation is not imposed on the material.

Further, the method for producing a module with a built-in component of the present invention can simplify the production procedures and reduce the production cost since the via forming process which requires a high precision can be omitted. In addition, since apparatuses such as a puncher and a laser equipment are not required, the production cost is reduced in that point. Further, since the module with a built-in component is formed by folding a module-forming member which has a wiring pattern and a sheet-like insulating layer formed thereon, it is not necessary to carry out alignment of the positions of the lands on the upper and the lower surfaces of the module, which alignment is required in the via connection. Further, in the production method of the present invention, it is not necessary to carry out the step of registering the via and the land which step is conducted in the method for producing a module with a via.

Further, the U/L-shaped side wiring 20 is relatively easily formed by folding the module-forming member and may be adapted to a narrower pitch compared with the via connection. Further, the reliability of the module with a built-in component can be improved by connecting the upper surface and the lower surface with the U/L-shaped side wiring 20, not the via. That is, in the case of the via connection, since the electrical connection is made by a contact between the via portion (a conductive paste or a plating) and the land portion, when the substrate expands in the thickness direction, the contact portion may separate, resulting in low reliability of the module. On the other hand, according to the present invention, since the U/L-shaped side wiring 20 that is processed from the metal layer (such as a copper foil) (that is, the U/L-shaped side wiring is a single wiring) connects the upper surface and the lower surface, the reliability can be improved compared with the via connection. The U/L-shaped side wiring 20 is preferably formed of a laminate having an electrolytic copper foil (ED foil). The U/L-shaped side wiring 20 formed of the electrolytic copper foil has a uniform thickness, which is advantageous to an impedance control and/or formation of the wiring pattern.

Further, the production method of the present invention has an advantage in that examination can be conducted halfway in the production of the module. For example, since the electrical connection between the electronic component and the wiring pattern can be completed in the middle of the process for producing the module-forming member as shown in FIG. 4(c), electrical examination can be carried out at this stage. The examination can be performed by checking an electrical resistance at a predetermined position and testing automatically with, for example, a scanner or a multimeter. Further, in addition to the check of the electrical resistance, actual operation can be checked. When these examinations show poor connection in the module-forming member, the electronic component can be easily repaired or replaced. As a result, the yield can be improved in the production of the module. Further, the repair or the replacement is very advantageous when producing a prototype of module with a built-in component (or module with a built-in component). On the contrary, it is difficult to examine the electrical connection between the electronic component and the wiring in the middle of the production of the conventional module with a built-in component 400 shown in FIG. 1.

The production method of the present invention makes it possible to provide the module without the step of forming the via, which step was required in the conventional module, resulting in improvement of the production efficiency of the module with a built-in component. Further, the module of the present invention does not require forming vias even if the mounting area is small, whereby more terminals can be provided. As a result, the module of the present invention can be adapted to a trend of miniaturization, higher pin count and narrower pitch. Furthermore, the connection distance between the electronic components can be short in the module of the present invention, and therefore noise of the module can be reduced.

Embodiment 2

Next, a module with a built-in component of the second embodiment is described with reference to FIGS. 7(a) and 7(b). FIG. 7(a) is a bottom view which schematically shows a constitution of the module with a built-in component 200 of this embodiment. FIG. 7(b) shows a schematic cross-sectional view of the module 200 shown in FIG. 7(a). However, the positions of the terminals 33 shown in FIG. 7(b) do not exactly correspond to the positions of the terminals shown in FIG. 7(a). Depending on an electronic component, an arrangement shown in FIG. 7(a) may be employed in one embodiment, while an arrangement shown in FIG. 7(b) may be employed in another. In any embodiment described below, a description with respect to the components, the elements and the production method already given in connection with the first embodiment is omitted or simplified for the simplification of the description.

The module 200 shown in FIGS. 7(a) and 7(b) has a semiconductor device 32 as an electronic component, a sheet substrate 10 wherein the semiconductor device 32 is embedded, and U/L-shaped side wirings 20 which extend on an upper surface 10a, a lower surface 10b and a side surface 10c of the sheet substrate 10. As described above, the semiconductor device 32 in the module 100 shown in FIG. 2 is electrically connected to the U/L-shaped side wirings 20. In the module 200 in accordance with this embodiment, the semiconductor device 32 is only embedded in the sheet substrate 10 and not electrically connected to the U/L-shaped side wirings 20.

In the module 200 of this embodiment, the bottom surface of the semiconductor device 32 is exposed on the bottom (lower) surface 10b of the sheet substrate 10 and a plurality of terminals 33 are arranged two-dimensionally in the bottom surface of the semiconductor device 32. In the bottom surface 10b of the sheet substrate 10, a plurality of lands 20b to which the U/L-shaped side wirings 20 are connected are provided. Since the semiconductor device 32 and the U/L-shaped side wirings 20 are not directly connected electrically in the module 200 of this embodiment, the electrical connection between them may optionally be made through a wiring board (such as a mother board) by mounting them to the wiring board. The module of this embodiment has an advantage in that there is no need to connect the built-in semiconductor device 32 to other wirings or elements. In addition to the semiconductor device 32, a passive component (such as a chip part 34 as shown in FIG. 3) may be disposed within the sheet substrate 10.

Figure 7:
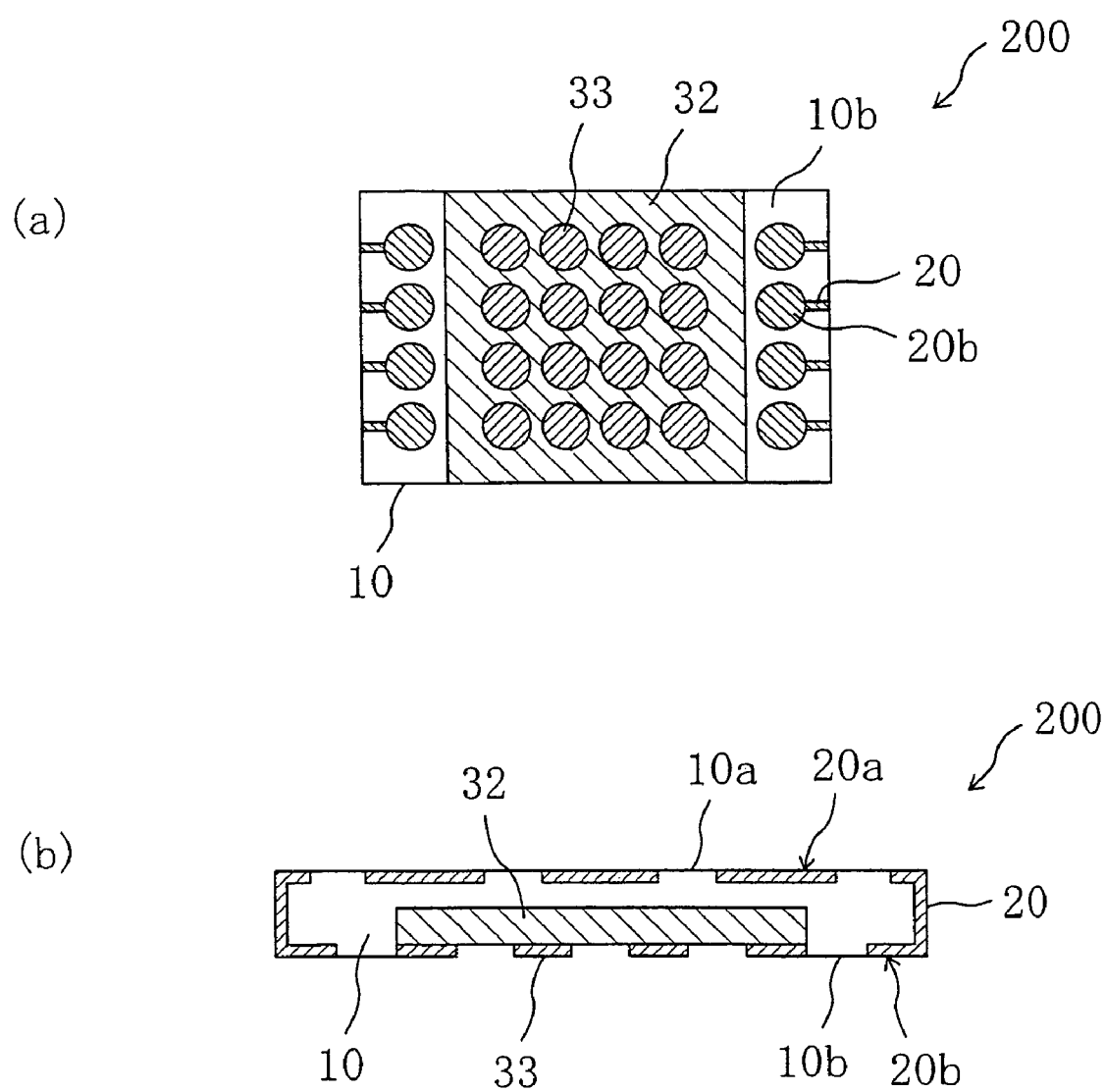
FIGS. 7(a) and (b) are a bottom view and a cross-sectional view schematically showing a module with a built-in component 200 in accordance with a second embodiment of the present invention.

In this embodiment, the semiconductor device 32 may be, for example, an area-array semiconductor package wherein the terminals 33 are arranged into an area array. In the embodiment shown in FIG. 7, an area-array CSP (an area-array chip-size package) is employed. As the area array CSP, for example, a CSP of LGA (land grid array) type, or a CSP of BGA (ball grid array) type may be used. The semiconductor device 32 (area-array CSP) shown in FIG. 7 is the CSP of LGA type. As the area-array CSP, a construction wherein a bare chip is mounted on an interposer and a peripheral terminal arrangement of the bare chip is changed into the area-array terminal arrangement (for example, an FBGA or an FLGA) may be used. Alternatively, a construction wherein an insulating layer is formed on the bare chip without interposer and a wiring is fan out (that is, drawn) on the insulating layer so as to convert the peripheral terminal arrangement into the area array terminal arrangement (for example, an RCSP or a real size CSP) may be employed.

Next, an embodiment of a method for producing the module 200 of this embodiment is described with reference to FIGS. 8(a) to 8(c).

Firstly, a member "B" for producing a module with a built-in component is prepared. The member "B" has a constitution wherein a wiring pattern 44 is formed on the carrier sheet 40 and an insulating layer 15 is formed on the wiring pattern 44 and the electronic component 32 (the area-array CSP) as the electronic component is disposed on the insulating layer 15 as shown in FIG. 8(a). The insulating layer 15 is, for example, a resin layer in the semi-cured state which is formed on the carrier sheet 40 with the wiring pattern 44. The wiring pattern 44 has wirings which are to be the U/L-shaped side wirings 20. Such a member "B" is obtained by forming the wiring pattern 44 through the steps as shown in FIGS. 4(a) to 4(d) and then forming the insulating layer 15 on the carrier sheet so as to cover the wiring pattern 44 and subsequently disposing the electronic component 32.

As shown in FIG. 8(b), the right side of the member "B" is bent together with the carrier sheet 40. Next, as shown in FIG. 8(c), the insulating layer 15 is folded so that portions 15-1 and 15-2 of the insulating layer 15 are opposed to each other, whereby a part of the shape of the sheet substrate 10 is formed. These portions of the insulating layer may be in contact with each other (the contact plane is indicated by a dotted line), or there may be a gap between the opposed portions of the insulating layer. As a result of this folding, a side-surface wiring portion of the U/L-shaped side wiring 20 extends on the bent portion of the insulating layer 15. This bent portion becomes the side surface of the sheet substrate 10. The left side of the insulating layer 15 of the member "B" is similarly folded and thereby the entire shape of the sheet substrate 10 is completed. Next, the folded body is heated and pressurized so that the resin is completely cured and thereby the module with a built-in component 200 of the present invention which has the sheet substrate 10 is obtained.

Figure 9:
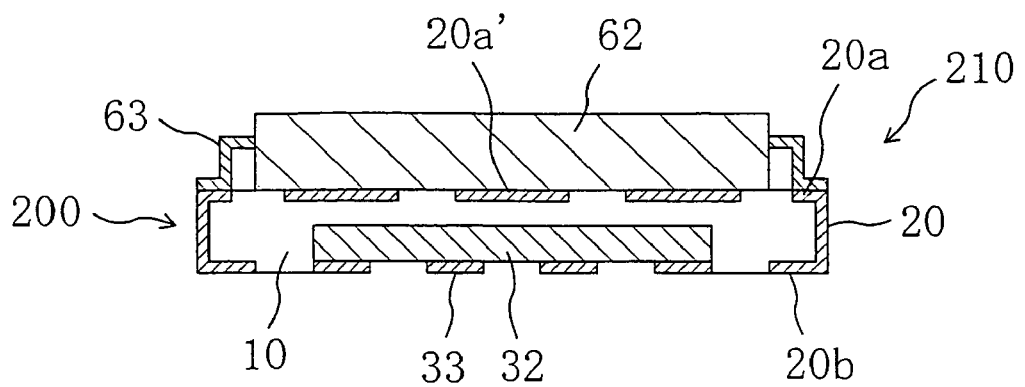
FIG. 9 is a cross-sectional view schematically showing a module with a built-in component 210 in accordance with the second embodiment of the present invention.

Next, a modification of the module 200 is described. In one modification, an additional electronic component may be mounted on the module 200 of the present invention. FIG. 9 shows a module with a built-in component 210 which is obtained by mounting a semiconductor package as the additional electronic component 62 on the upper surface of the module 200 shown in FIG. 7. In the module with a built-in component 210 as shown in FIG. 9, terminals 63 (leads) of the semiconductor package 62 are connected to the terminals 20a (lands). The terminals 20a are disposed on the upper surface of the sheet substrate 10 and connected to the U/L-shaped side wirings 20. In the embodiment shown in FIG. 9, the electronic components 32 and 62 are arranged three-dimensionally (that is, stacked in the thickness direction of the sheet substrate), which means that the substantially available mounting area is increased.

In FIG. 9, the numeral 20a' denotes a wiring portion of a wiring pattern which extends from the land 20a and a circuit is formed including the wiring portion. There may be a gap between the semiconductor package 62 and the upper surface of the sheet substrate 10. A solder resist may be formed on the upper surface of the sheet substrate 10. Further, when the lead 63 has a certain lead height (or length), another electronic component can be disposed between the upper surface of the sheet substrate 10 and the semiconductor package 62.

Figure 10:
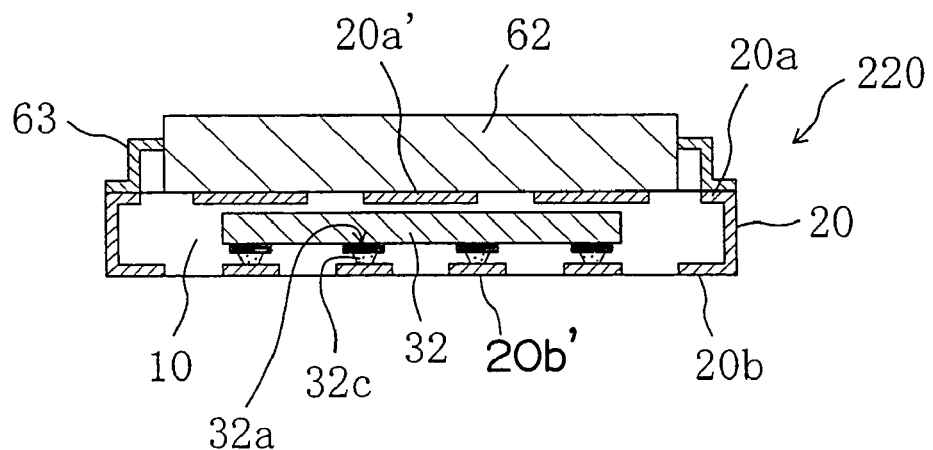
FIG. 10 is a cross-sectional view schematically showing a module with a built-in component 220 in accordance with the second embodiment of the present invention.

A module with a built-in component 220 shown in FIG. 10 is different from the module 210 shown in FIG. 9 in the construction of the semiconductor device 32. In the module 220 shown in FIG. 10, the semiconductor device 32 may be, for example, a bare chip, and the bare chip is flip-chip mounted. The device terminals 32a of the bare chip 32 are connected to the wiring 20b' through connection members 32c (such as bumps). The wiring 20b' and other wirings may be connected to each other or the wiring 20b' may be a separate land. The wiring 20b' may function as a terminal for connecting the module with a built-in component to another board, and it is referred to as a "terminal" in that meaning. When the wiring 20b' to which the semiconductor device 32 is connected functions as the terminal, arrangement of the terminals 20b' may be a one dimensional arrangement (a peripheral pad) or a two-dimensional arrangement (an area-array arrangement). Further, the wiring 20b' may be formed as the terminal 20b to which the U/L-shaped side wiring 20 is connected, or the wiring 20b' and the U/L-shaped side wiring may not be electrically connected. This module 220 may be produced by the first production method.

Figure 11:
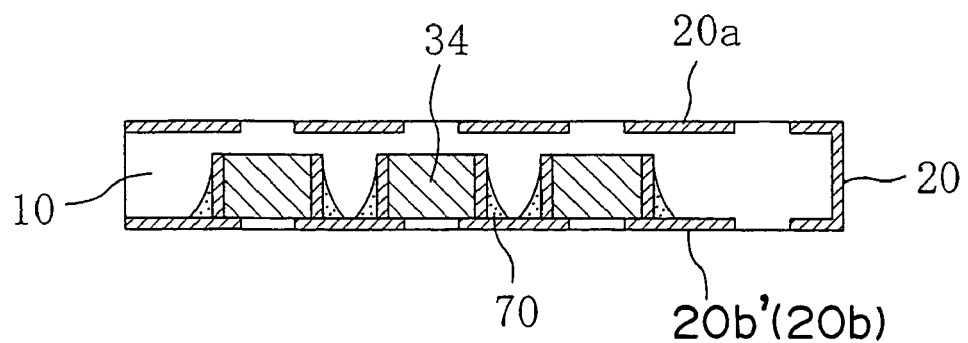
FIG. 11 is a cross-sectional view schematically showing a module with a built-in component in accordance with the second embodiment of the present invention.

In the embodiments shown in FIGS. 9 and 10, another electronic component (such as a chip part) may be embedded in the sheet substrate 10 in addition to the semiconductor device 32. In the first and the second embodiments, the semiconductor device 32 is embedded in the sheet substrate 10. Alternatively, a module with a built-in component of the present invention may be constructed so that, as shown in FIG. 11, only the passive component 34 (such as the illustrated chip parts) is embedded or the passive component is additionally embedded. The passive components 34 illustrated in FIG. 11 are electrically connected to portions of the wirings 20b' with solder 70. The wiring 20b' may be an electrical element (such as a land) to which an end portion of the U/L-shaped side wiring 20 is electrically connected.

Figure 13:
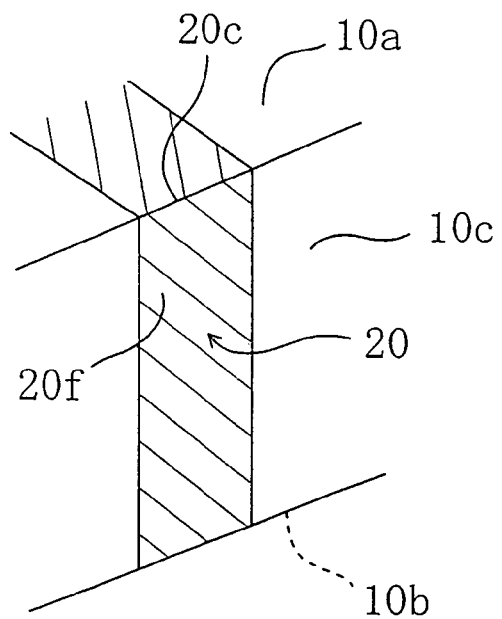
FIG. 13 is an enlarged view of a substantial part of a U/L-shaped side wiring 20 in the module with a built-in component of the present invention.

The U/L-shaped side wiring 20 on the surface of the sheet substrate 10 is entirely embedded in the surface of the sheet substrate 10 by forming, through the steps shown in FIGS. 4(a) to 5(c), the wiring pattern 44 including the wiring 20 which is to be the U/L-shaped side wiring. That is schematically shown in FIG. 13, which is an enlarged perspective view of a part of the sheet substrate. That is, as illustrated in FIG. 13, the top surface 20f (exposed surface) of the wiring 20 is substantially flush with the surface (for example, a side surface 10c) of the sheet substrate 10. This configuration of the U/L-shaped side wirings 20 suppresses break or damage of the wiring 20 and thereby increases the reliability of the wiring 20 more effectively compared with a configuration wherein the wiring 20 (particularly the corner portion 20c) is protruded from the surface of the sheet substrate.

Figure 12:
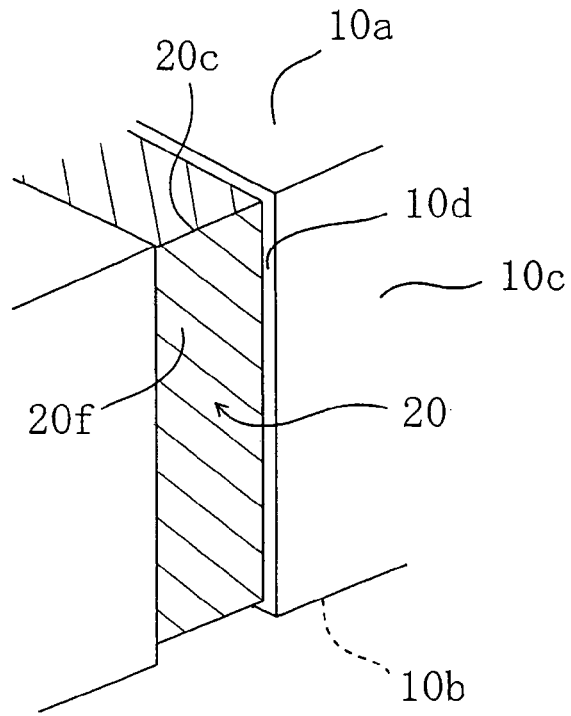
FIG. 12 is an enlarged view of a substantial part of a U/L-shaped side wiring 20 in the module with a built-in component of the present invention.

Further, as shown in FIG. 12, when the exposed surface 20f of the U/L-shaped side wiring 20 is located at a position which recesses from the side surface 10c of the sheet substrate 10 and thereby is located inside the sheet substrate 10, the possibility of contact between the exposed surface 20f and an external thing is significantly reduced, whereby the break and the damage of the U/L-shaped side wiring 20 can be effectively reduced. Particularly the corner portion 20c of the U/L-shaped side wiring 20 preferably recesses in relative to the surface of the sheet substrate (or an edge) as shown in FIG. 12 from the viewpoint of protection of the wiring, since the corner portion 20c tends to contact with an external thing. Therefore, the exposed surfaces of the upper-surface wiring portion and/or the lower-surface wiring portion of the U/L-shaped side wiring 20 are preferably disposed at the positions concave from the surfaces of the sheet substrate.

The configuration as shown in FIG. 12, wherein the top (or the exposed) surface 20f of the wiring 20 sinks in relative to the side surface 10c of the sheet substrate and a step 10d is formed, may be realized by the following method. Firstly, in the step of forming the wiring pattern 44 shown in FIG. 4(b), a concave is formed in the carrier sheet 44 by etching away, in addition to an unnecessary portion of the metal layer 42, a portion of the carrier sheet 40 which is beneath the unnecessary portion (that is, the portion which does not form the wiring pattern) of the metal layer 42. Next, the step of applying the resin material (for example, a composite material) for forming the insulating layer is carried out as shown in FIG. 5(a) to give the module-forming member wherein the resin material goes over the surface of the wiring pattern 44 (that is, a contact plane between the metal layer and the carrier sheet) and enters into the concavity in the carrier sheet 40. This member is folded and then heated and pressurized. The carrier sheet is subsequently removed, resulting in the step 10d between the surface of the sheet substrate 10 and exposed surface of the U/L-shaped side wiring 20. This method makes it possible to form the step 10d whose height corresponds to the depth of the concavity formed in the carrier sheet.

Alternatively, it is possible to apply a resin or a film for protecting the U/L-shaped side wiring 20 to the sheet substrate 10 except for the portion where the wiring is disposed, in order to make the step between the top surface 20f of the U/L-shaped side wiring 20 and the surface of the sheet substrate 10 or to make the top surface 20f flush with the surface of the sheet substrate.

Figure 14:
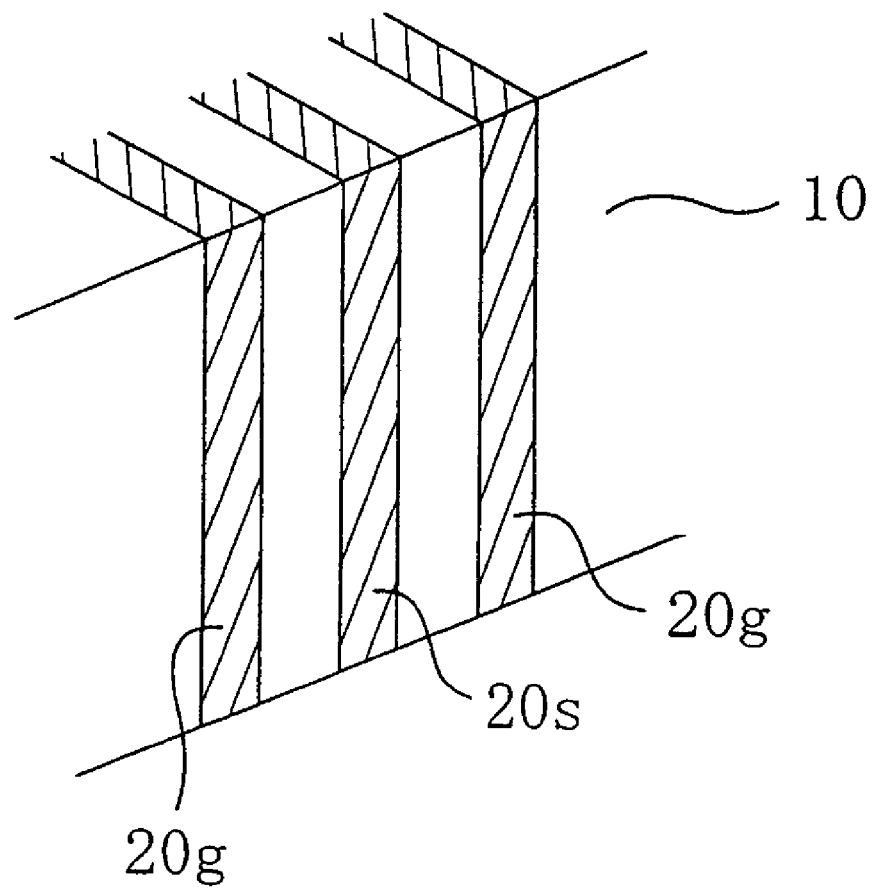
FIG. 14 is an enlarged view of a substantial part of a U/L-shaped side wiring 20 in the module with a built-in component of the present invention.

Further, in the module with a built-in component 100 of the present invention, the U/L-shaped side wirings may be a coplanar line. This makes it possible to constitute a module which is suitable for a high-speed wiring. More specifically, as shown in FIG. 14, when the U/L-shaped side wiring 20s is formed as a signal line and the U/L-shaped side wirings 20g are formed as ground lines on both side of the signal line 20s, they form the coplanar construction. This construction controls a characteristic impedance and avoids a problem of impedance mismatch between the via and the wiring, which problem occurs in the module with vias.

Embodiment 3

The method for producing a module with a built-in component of the present invention includes folding a module-forming member which has a sheet 15 containing a semi-cured resin, and then completely curing the sheet 15 so as to give the sheet substrate 10. This method makes it possible to easily produce a module having a three-dimensional construction (that is, construction having a certain dimension also in the thickness direction of the sheet substrate) depending on a folding manner. For example, the module which has either concavity or convexity or both may be fabricated. Such a board may be formed by folding the sheet 15 so that the shape of the sheet 15 has either concavity or convexity or both and then completely hardening the sheet 15. A production method for producing such a module is described as the third embodiment.

Figure 15:
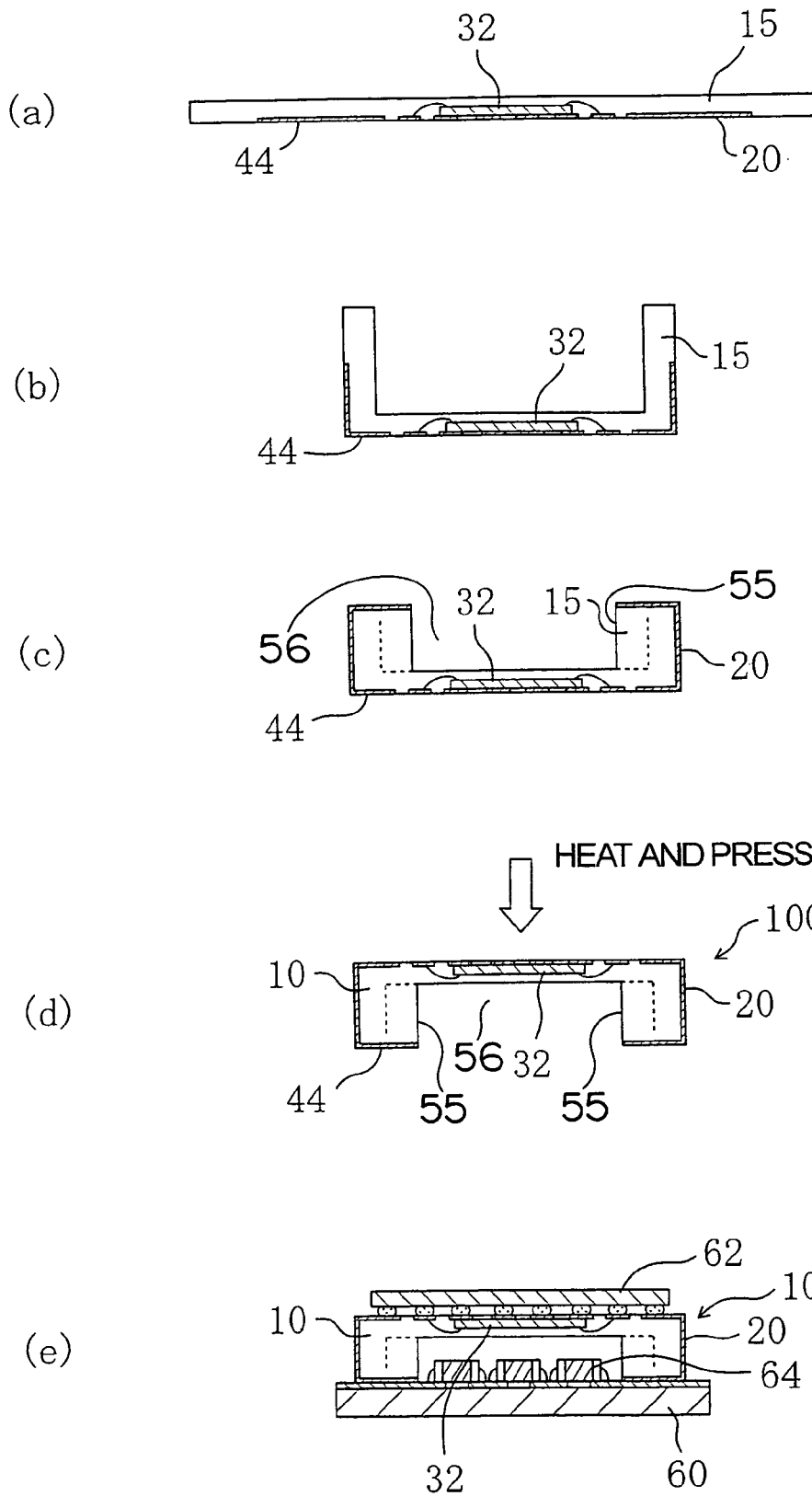
FIGS. 15(a) to 15(e) are sectional views which schematically show the steps in a method for producing a module with a built-in component 100 in accordance with a third embodiment of the present invention.

Such a module with a built-in component may be produced by a method which includes the steps shown in FIGS. 15(a) to 15(e). Firstly, a member "A" for forming the module with a built-in component as shown in FIG. 15(a) is prepared. The member "A" is a sheet 15 (containing a semi-cured resin) which has a wiring pattern 44 formed thereon and an electronic component 32 embedded therein. Next, as shown in FIGS. 15(b) and 15(c), the sheet 15 is bent so that it has convexities 55 and a concavity 56. Next, the sheet 15 is heated and pressurized so that a module 100 which has a three dimensional shape (herein, a "U" shape) is obtained as shown in FIG. 15(d).

The module 100 shown in FIG. 15(d) may become a three-dimensionally mountable module as shown in FIG. 15(e). More specifically, the lower surfaces of the convexities 55 (the undermost surface shown in FIG. 15(d)) of the module 100 is mounted to a printed board 60 and another electronic component 64 (such as a chip part) which is mounted to the printed board 60 may be disposed between the module 100 and the printed board 60. A still another electronic component (such as a semiconductor device) is mounted on the top surface (the uppermost surface in FIG. 15(d)) of the module 100. That is, when the module 100 shown in FIG. 15(d) is employed, other electronic components 62 and 64 are three-dimensionally mounted in addition to the built-in electronic component 32 in the same area viewed from above. As a result, even when the mounting area is small, more electronic components can be mounted.

In the case where a semiconductor chip with a narrow pitch and a high pin count is employed as the built-in electronic component (for example, the semiconductor chip 32 in FIG. 15(e)) and/or the electronic component which is placed on the module 100 (for example, the semiconductor chip 62 in FIG. 15(e)), a semiconductor chip with a pitch interval between terminals of 150 µm or less or a semiconductor chip having sixteen or more terminals may be preferably employed. Other electronic components such as a surface mount device (a chip device, such as a chip inductor, a chip resistor and a chip capacitor) may be mounted on the module 100. Alternatively, both of the semiconductor chip and the surface mount device may be mounted on the module 100.

The shape of the module 100 of this embodiment is not limited to the one illustrated in FIG. 15(d). Different shapes having various concavities and convexities can be realized in the module 100 depending on the folding manner. On the contrary, in the case of the module wherein the vias ensure the conduction between the upper and the lower surfaces, some shapes of the module may cause deformation of the vias or make the registry of the vias difficult, resulting in the low connection reliability. Further, since the module of the present invention can be produced by folding a resin sheet in a semi-cured state and then completely hardening the folded resin sheet, the module of the present invention can be relatively freely and easily made into any shape, and therefore, the present invention is advantageous from the viewpoint of shape flexibility.

Further, in the case of the module with vias, it is difficult to change (particularly thicken) the thickness of the module. In other words, when the thickness is too large in the module with vias, the vias (through hole) having a high aspect ratio have to be formed, which makes it difficult to form the vias appropriately. For example, when a laser beam is used for perforation, a tapered via tends to be formed. On the other hand, when a drill is used for perforation, the via tends to curve or the drill may bend or break. In the module 100 of this embodiment, since the conduction between the electrical element on the upper surface and the electrical element on the lower surface is ensured by the U/L-shaped side wiring 20, the problem which occurs in the vias having the high aspect ratio can be avoided.

Embodiment 4

Figure 16:
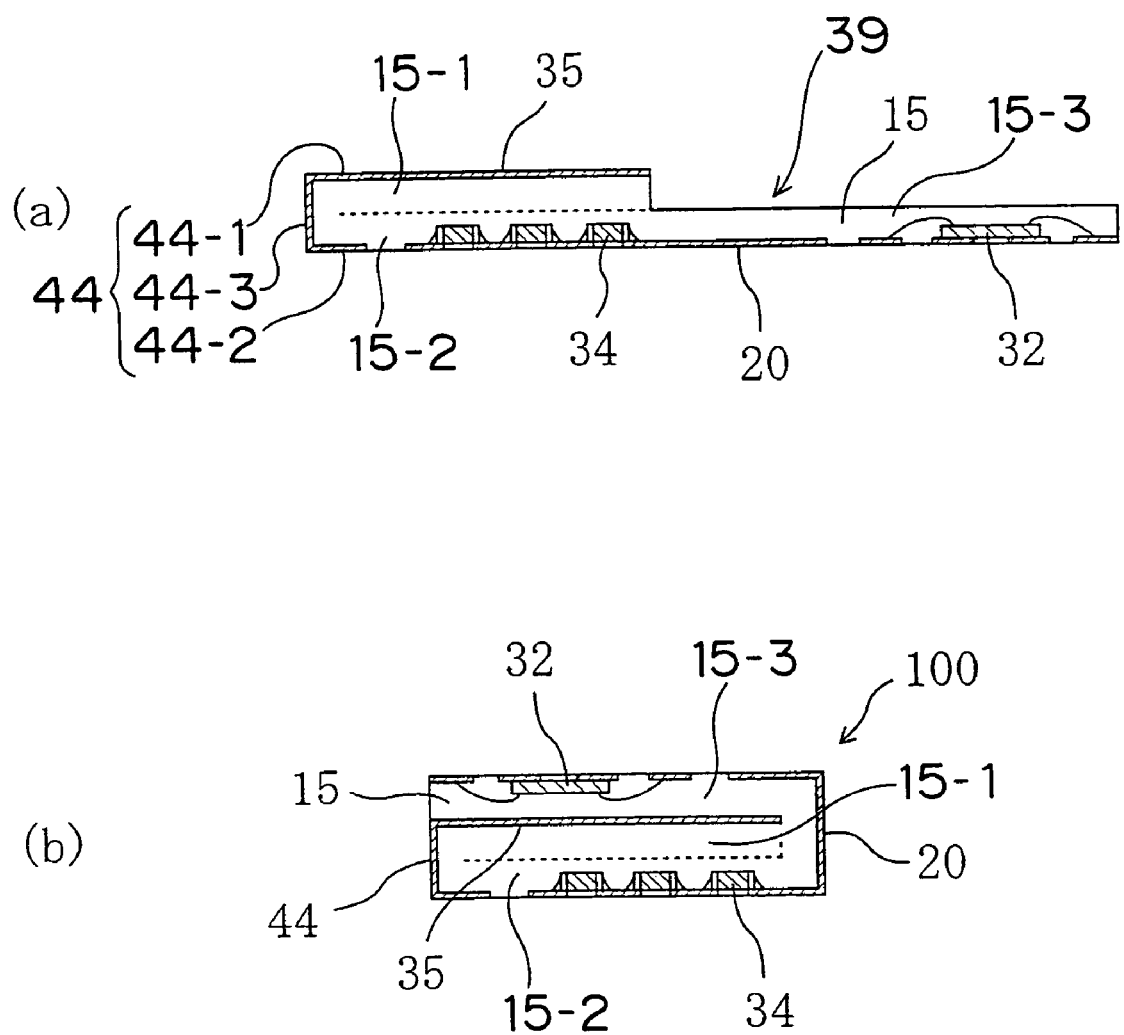
FIGS. 16(a) and 16(b) are sectional views which schematically show the steps in a method for producing a module 100 having a shield member 35 (shield layer) in accordance with a fourth embodiment of the present invention.

In another embodiment of the module with a built-in component of the present invention, a shield member 35 (shield layer) may be provided within the module 100 by selecting an appropriate folding manner as shown in FIGS. 16(a) and 16(b). As illustrated, the shield member 35 may be formed within the module by merely folding the sheet 15. That is, the shield member can be easily added. In this case, the shield member 35 is basically formed of the same material as that of the U/L-shaped side wiring 20. This technique enables the shield member to be easily introduced into the module with a built-in component and facilitates to take measures to noise.

The module with a built-in component which has the shield member may be produced by conducting the folding step (B) as follows in any of the first and the second methods. Firstly, the left side portion 15-1 of a module-forming member 39, which is similar to the member "A" shown in FIG. 5, is bent together with a wiring which is under the portion 15-1, so that the portions 15-1 and 15-2 of the insulating layer are opposed to each other as shown in FIG. 16(a) and the portions 44-1 and 44-2 of the bent wiring are opposed to each other across the opposed portions 15-1 and 15-2 of the insulating layers, while the remaining portion 44-3 of the wiring 44 extends on the side surface of the opposed portions 15-1 and 15-2 of the insulating layer.

Next, the right side portion 15-3 of the insulating layer is bent together with the wiring which is positioned under the portion 15-3, so that the portion 15-3 is placed on the wiring portion 44-1 and the portions 15-1 to 15-3 are opposed to each other so as to form the U/L-shaped side wiring 20, and thereby the wiring portion 44-1 which has been bent is disposed between the portions of the insulating layer to become the shield member 35.

When the shield member 35 is formed inside the module 100 (that is, inside the sheet substrate 10) and the module 100 with the shield member is mounted on a board (such as a mother board), the shield member 35 can block an electromagnetic wave from the board and protect the electronic component 32. Further, when the electronic components 32 and 34 are disposed on both sides of the upper and lower surfaces of the sheet substrate in the module 100 as shown in FIG. 16(b), the shield member 35 placed between the electronic components 32 and 34 can effectively suppress the interference of electromagnetic waves between the electronic components 32 and 34 which are placed adjacent to each other inside the module 100.

A plurality of modules 100 of this embodiment can be stacked to form a stacked module. For example, on a first module 100, another second module 100 may be disposed. In this case, these modules are electrically connected in a predetermined manner. Further, a multilayer board (including three or more board) can be fabricated. The modules 100 of the same type may be stacked or the modules of different types may be stacked. For example, a multilayer board may be fabricated using the module wherein a semiconductor memory is embedded as the first module 100 and the module wherein an LSI (such as a logic LSI) is embedded as the second module 100. The multilayer board may be fabricated using other modules which do not include the shield member as described below.

Embodiment 5

In the embodiments described above, the U/L-shaped side wiring is a "U"-shaped side wiring which extends on both of the upper and the lower surfaces of the sheet substrate in addition to the side surface of the sheet substrate. In another preferred embodiment, the U/L-shaped side wiring does not exist on one of the upper surface and the lower surface. In other words, the U/L-shaped side wiring may be an "L"-shaped side wiring which extends on the side surface of the sheet substrate and one of the upper and the lower surfaces of the sheet substrate. The "L"-shaped side wiring may have an exposed surface which is substantially flush with the side surface or the upper or the lower surface of the sheet substrate, or may protrude from the side surface. Alternatively, the "L"-shaped side wiring may be recessed from the side surface and the upper (or the lower) surface of the sheet substrate. Such a configuration is shown in FIG. 17.

Figure 17:
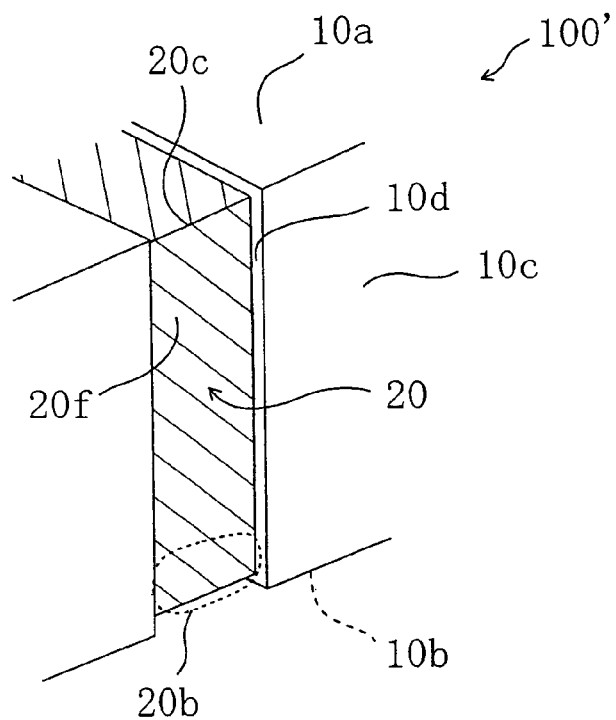
FIG. 17 is an enlarged view of a substantial part of a U/L-shaped side wiring 20 in the module with a built-in component 100' in accordance with a fifth embodiment of the present invention.

In the module 100' shown in FIG. 17, one end portion 20b of the U/L-shaped side wiring 20 is positioned on the lower edge of the side surface of the sheet substrate 10 (that is, a boundary portion between the side surface 10c and the lower surface 10b (or a corner portion)). The U/L-shaped side wiring 20 does not extend on the lower surface 10b.

The constitution shown in FIG. 17 is similar to that shown in FIG. 12. The exposed surface 20f of the U/L-shaped side wiring 20 on the side surface 10c is located at an interior position of the sheet substrate 10 compared with the side surface 10c. Further, the exposed surface 20c of the U/L-shaped side wiring 20 on the upper corner portion of the sheet substrate 10 is also located at an interior position of the sheet substrate compared with a surface of the corner portion.

Figure 18:
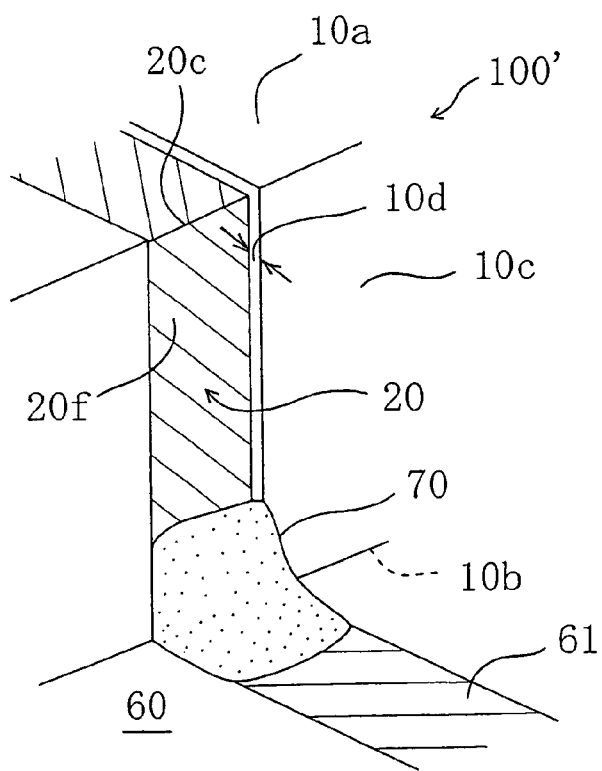
FIG. 18 is an enlarged view of a substantial part which shows soldering of the module 100' of FIG. 17 to a printed board 60.

FIG. 18 schematically shows an embodiment of mounting the module with a built-in component 100' as shown in FIG. 17 on a printed board 60. A solder connection portion 70 is formed on the end portion 20 of the U/L-shaped side wiring 20 (see FIG. 17) to electrically connect the module 100' with a wiring pattern 61 of the printed board 60. In the module 100' shown in FIG. 17, the U/L-shaped side wiring makes a recess whose depth from the side surface of the sheet substrate corresponds to the step 10d, whereby a groove portion is made in the side surface 10c. This groove portion is advantageous because it serves as a guide as well as a dam for storing the solder. Further, when employing soldering shown in FIG. 18 as a mounting method, the solder sticking can be easily checked by observing the printed board 60 from above (for example, in a vertical direction). The module 100' wherein the U/L-shaped side wiring 20 terminates on the side surface facilitates an examination of the solder connection portion after soldering.

Figure 19:
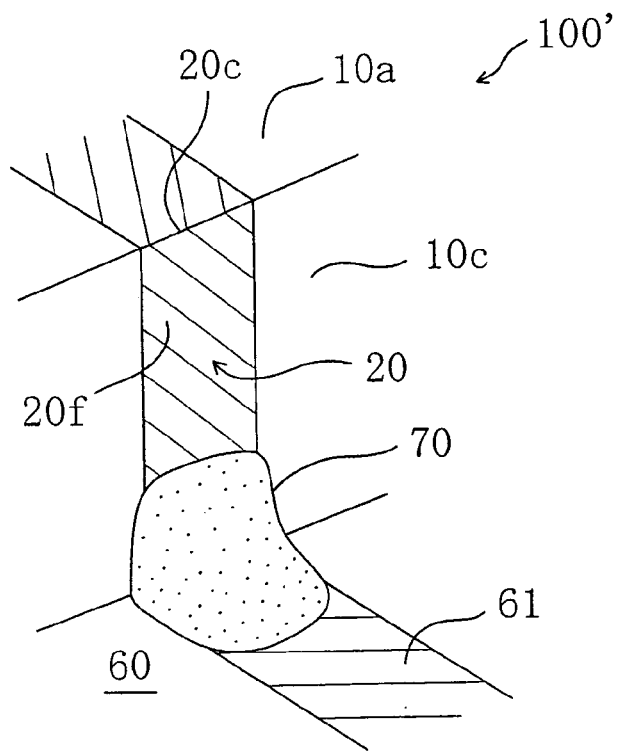
FIG. 19 is an enlarged view of a substantial part which shows soldering of the module 100" in accordance with the fifth embodiment of the present invention to a printed board 60.

FIG. 19 shows a module with a built-in component 100" wherein the exposed surface 20f that is the top surface of the U/L-shaped side wiring 20 is coplanar with the side surface 10 of the sheet substrate 10. Also when there is no step 10d as shown in FIG. 17 (or when the top surface 20f of the U/L-shaped side wiring 20 protrudes from the side surface 10c), the solder connection portion 70 can be provided at the end portion of the U/L-shaped side wiring 20 so as to connect the module 100" and the wiring pattern 61 of the printed board 60 by soldering. Also in this case, the solder connection portion can be easily examined.

From the viewpoint of the solder connection, the end portions 20b of the U/L-shaped side wirings 20 are preferably spaced with a constant interval on the side surface 10c of the sheet substrate 10. In this case, not only the end portions, but also the side-surface wiring portions of the U/L-shaped side wirings may be arranged with a constant interval on the side surface of the sheet substrate.

Figure 20:
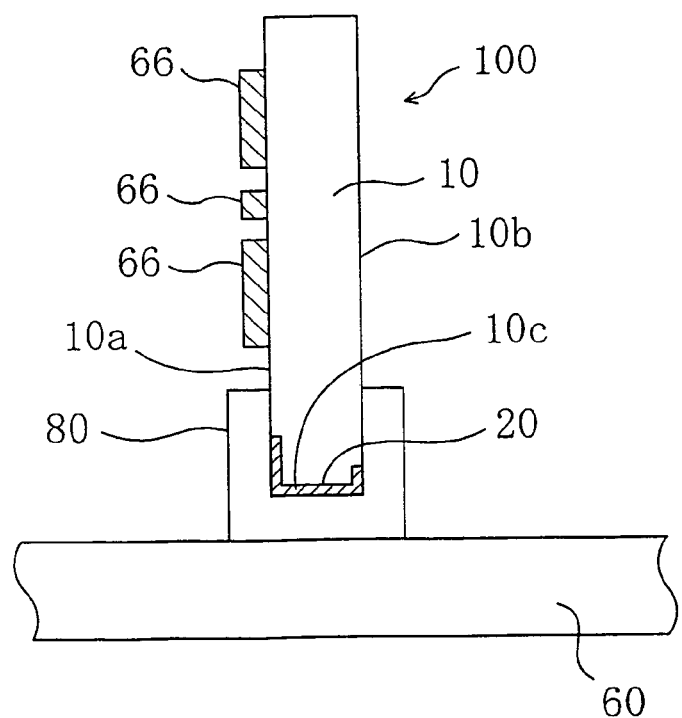
FIG. 20 is a cross-sectional view of a construction wherein a module with a built-in component 100 is mounted on a printed board 60 through a connector 80.

Any module with a built-in component can be mounted as shown in FIG. 20 since the U/L-shaped side wiring 20 extends on the side surface 10c of the sheet substrate 10. For example, a module including the module with a built-in component 100 as illustrated in FIG. 2 and electronic components 66 (such as chip parts or semiconductor chips) mounted thereon may be fitted into a connector (mechanical connector) 80 which is disposed on a printed board 60 (a mother board). In this case, the module and the printed board 60 are electrically connected via the connector 80 since the side-surface wiring portion of the U/L-shaped side wiring 20 in the module 100 and the connector 80 are electrically and physically connected. The connector 80 is constructed such that the side surface 10c of the module 100 is fitted in. The connector 80 makes it possible to mount the electronic component 66 vertically whereby many components can be mounted in an electronic equipment whose mounting area is small. Although FIG. 20 shows the module shown in FIG. 2, the vertical mounting may be applicable to any module as described above or below.

Equipment with a small mounting area includes portable electronic equipment such as a cellular phone and a PDA. That is, am assembly which includes the electronic component 66, the module with a built-in component 100, the connector 80 and the printed board 60 facilitates the vertical mounting of the electronic components. The electronic component 66 may be mounted also on the lower surface 10b of the sheet substrate 10 of the module 100 depending on the wiring pattern of the module 100.

Embodiment 6

Figure 21:
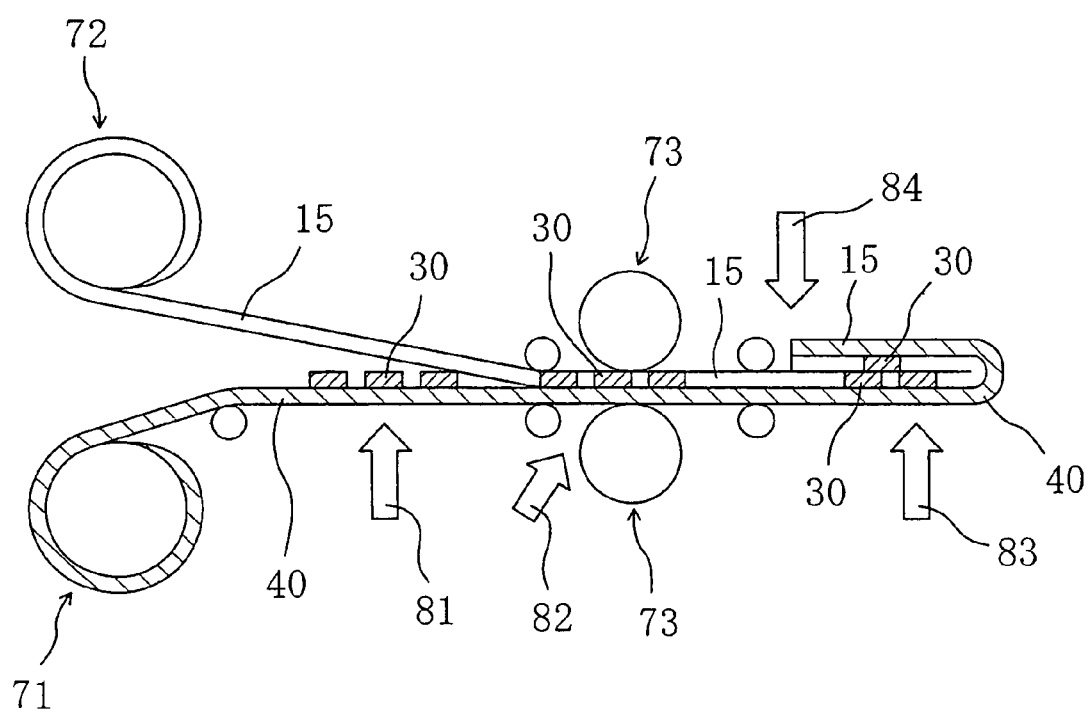
FIG. 21 is a sectional view which schematically shows steps in a method for producing a module with a built-in component in accordance with a sixth embodiment of the present invention.

A method for producing continuously a module with a built-in component of the present invention is described with reference to FIG. 21. FIG. 21 schematically shows steps in the production method of the present invention. The module of the present invention can be continuously produced by the method which includes the step wherein a roller is employed as shown in FIG. 21.

As shown in FIG. 21, a carrier sheet 40 which has a predetermined wiring pattern formed by processing a metal layer is supplied from a first roll 71 and a sheet 15 containing a semi-cured resin is supplied from a second roll 72. Next, an electronic component 30 is disposed on the carrier sheet 40 and/or the wiring pattern at a position indicated by an arrow 81. Next, the carrier sheet 40 and the sheet 15 are bonded between rolls 73 at the position indicated by an arrow 82, whereby the electronic component 30 is buried in the sheet 15.

The laminate including the sheet 15 with the built-in component 30 and the carrier sheet is bent at a position indicated by an arrow 83 into a desired shape, and then cut at a position indicated by an arrow 84, and subsequently heated and pressurized. As a result, a module with a built-in component of the present invention is obtained. When the placement of the electronic component on the wiring pattern does not give a desired electrical connection therebetween, or when the electronic component is placed on the carrier sheet, the electronic component 30 may be electrically connected to the wiring pattern after the placement of the electronic component (not shown).

In another embodiment, the electronic component 30 may be disposed on the sheet 15, not before the roll 73 but after the carrier sheet 40 with the wiring pattern and the sheet 15 have been bonded by the roll 73 to form a laminate. In that case, the module as shown in FIG. 56(c) may be obtained.

The production method shown in FIG. 21 is advantageous since it makes possible to continuously produce the module with a built-in component using the roll and a necessary conveying means is simple. Further, the continuous production of the module contributes to a shorter waiting time of a manufacturing apparatus and less work force compared with a batch-type production.

Embodiment 7

Various embodiments of the modules with built-in component of the present invention are described as a seventh embodiment with reference to FIGS. 22 to 55. Each of FIGS. 22 to 38 and FIGS. 43 to 55 is a schematic cross-sectional view of the module with a built-in component 300 of the present invention and each of FIGS. 39 to 42 is a bottom view (or top view) of the module 300 seen from beneath (or above). The description for matters which are not different from those described in the above embodiments is simplified or omitted. It is noted that the module shown in any of these drawings may be regarded as a modification of any of the above embodiments.

Figure 22:
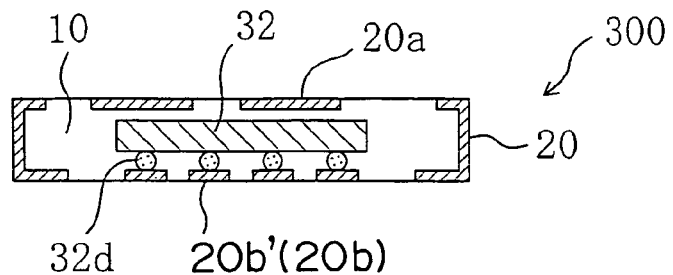
FIGS. 22 to 38 are cross-sectional views of examples of a module with a built-in component 300 in accordance with a seventh embodiment of the present invention, respectively.

The module with a built-in component 300 shown in FIG. 22 has a configuration wherein a semiconductor device (a bare chip) which is a built-in electronic component is connected to wirings 20b' with solder balls 32d. The wiring 20b' is formed on a bottom surface of the sheet substrate 10. The wiring 20b' may be an unconnected land or may be connected to other wiring, similarly to the wiring 20b' shown in FIG. 10. At least one of the wirings 20b' which are connected to the electronic component (that is, a part or all of wirings 20b') may be an electronic element which is connected to an end portion of a U/L-shaped side wiring 20, that is, terminal 20b. Also in this embodiment, the terminal 20b and the end portion of the U/L-shaped side wiring 20 preferably forms one body by processing a metal layer laminated on a carrier sheet.

Figure 23:
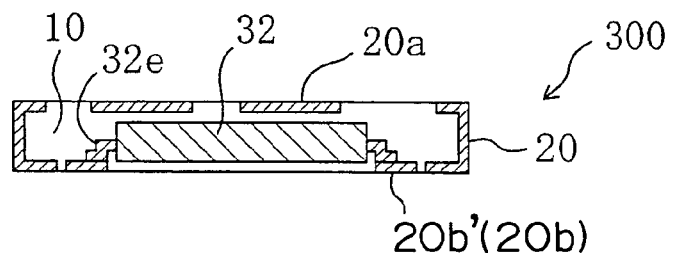

A module with a built in component 300 shown in FIG. 23 has a constitution wherein a semiconductor package 32 having leads 32e is embedded as an electronic component in the sheet substrate 10. The leads 32e of the semiconductor package 32 is connected to a wiring 20b' of a wiring pattern which is disposed on the bottom surface of the sheet substrate 10. At least one of the wirings 20b' may be a terminal 20b to which the U/L-shaped side wiring 20 is connected, similarly to the embodiment shown in FIG. 22. This module 300 may be produced by the first production method. In that case, a material of an insulating layer fills a space between the semiconductor package 32 and the carrier sheet during heating and pressurizing, which space is formed by connecting the semiconductor package 32 to the wiring pattern on a carrier sheet via the leads 32*e*. As a result, a bottom surface of the semiconductor package 32 is covered with the material of the sheet substrate.

Figure 24:
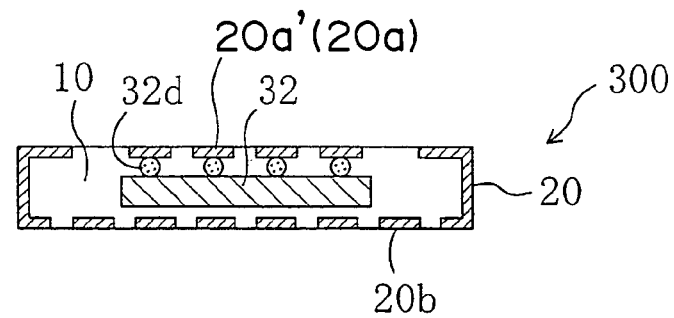

The configuration of the module with a built in component 300 shown in FIG. 22 may be turned upside down, resulting in a configuration as shown in FIG. 24. In this configuration, the electronic component 32 is connected to a wiring 20*a*' of a wiring pattern on the upper surface. The construction of the module 300 shown in FIG. 24 may be the same as that shown in FIG. 22, or may differ from that shown in FIG. 22. For example, in the configuration shown in FIG. 24, the positional relation between a terminal to which a component is mounted and a terminal which is employed for mounting the module to another board may be opposite to that in the configuration shown in FIG. 22.

Figure 25:
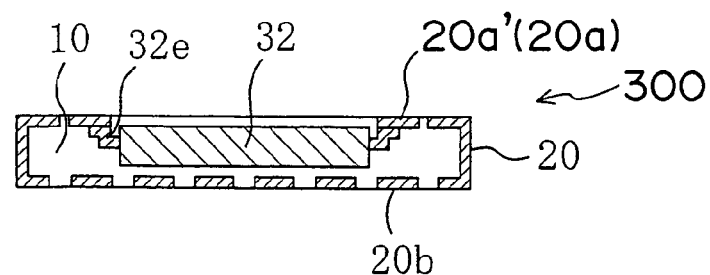

The configuration of the module with a built in component 300 shown in FIG. 23 may be turned upside down, resulting in a configuration as shown in FIG. 25. The construction of the module 300 shown in FIG. 25 may be the same as that shown in FIG. 23, or may differ from that shown in FIG. 23. For example, in the configuration shown in FIG. 25, the positional relation between a terminal to which a component is mounted and a terminal which is employed for mounting the module to another board may be opposite to that in the configuration shown in FIG. 23.

Figure 26:
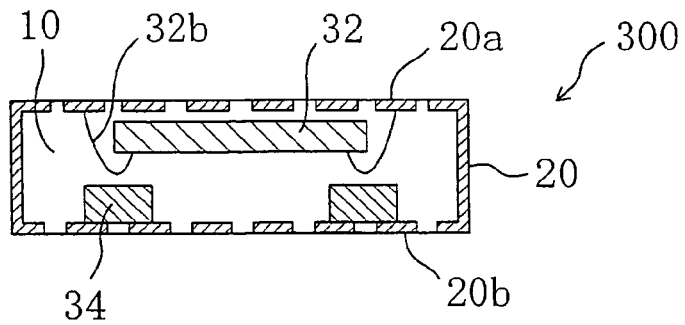

A module with a built-in component 300 shown in FIG. 26 has a configuration wherein a plurality of electronic components, for example, a semiconductor device 32 (bare chip) and chip parts 34 are embedded in the sheet substrate 10. The bare chip 32 is connected to terminals 20*a* with a metal thin wire 32*b*. The chip parts 34 are mounted in contact with terminals 20*b*. Both of the terminals 20*a* and 20*b* are electronic components connected to U/L-shaped side wirings 20. The chip parts 34 and the terminals 20*b* may be electrically connected through a connection member such as solder. This module may be produced by, for example, the second production method which has been described with reference to FIG. 57.

Figure 27:
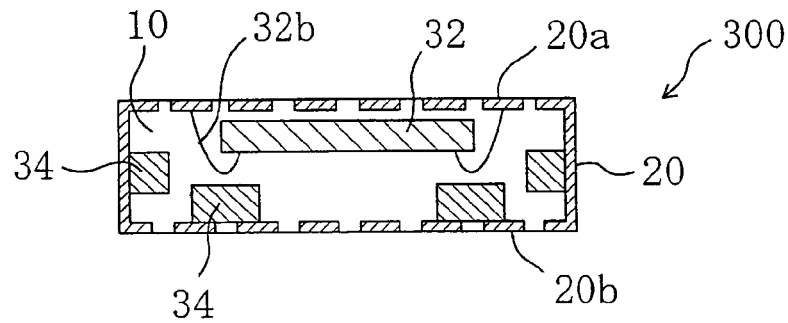

A module with a built-in component 300 shown in FIG. 27 has a configuration wherein additional electronic components such as chip parts 34 are mounted to the inside of the side surface of the sheet substrate 10. This module 300 corresponds to a configuration wherein the chip parts 34 are further embedded in the module shown in FIG. 26. In this module 300, the chip parts 34 are mounted contacting with the portion of U/L-shaped side wiring 20 which portion is located on the side surface of the sheet substrate 10.

Figure 28:
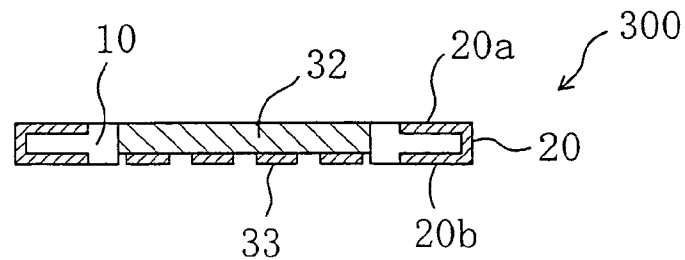

A module with a built-in component 300 shown in FIG. 28 is the same as the module 200 shown in FIG. 7(*b*) except that both of the top and the bottom surfaces of an electronic component, such as a semiconductor device 32 are exposed on both of the upper and the lower surfaces of the sheet substrate 10. In this constitution, one surface of the electronic component which is opposite to the surface where terminals 33 are formed are exposed from the insulating substrate 10, whereby the heat release from the electronic component is enhanced. This module may be produced by placing the semiconductor device 32 on the exposed surface of the carrier sheet and then carrying out the steps similar to those shown in FIG. 8.

Figure 29:
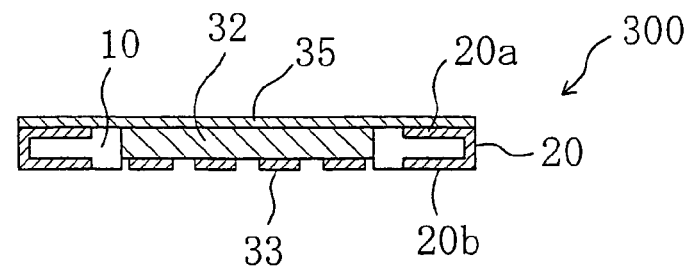

A module with a built-in component 300 shown in FIG. 29 is obtained by forming a metal film 35 on the upper surface of the module shown in FIG. 28. In the embodiment shown in FIG. 29, the metal film 35 functions as a heat releasing member which facilitates and enhances heat releasing from the upper surface of the semiconductor device 32. The metal film 35 may be electrically insulated from a wiring pattern by isolating at least a portion of the metal film 35 which contacts with the wiring pattern. The electrical insulation between the wiring pattern and the metal film may be realized by, for example, disposing a resin film therebetween. Further, a heat releasing fin may be provided on the metal film.

Figure 30:
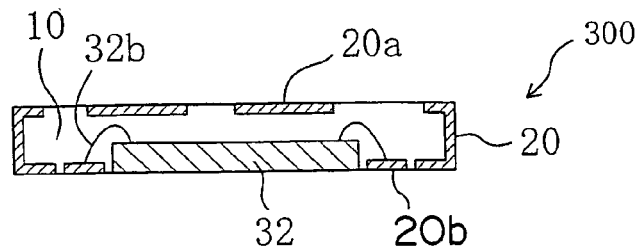

A module with a built-in component 300 shown in FIG. 30 has a configuration wherein the bottom surface of a semiconductor device 32 (a bare chip) is exposed on the lower surface of the sheet substrate 10. The bare chip 32 is connected to terminals 20*b* via metal thin wires 32*b*. The terminals 20*b* are connected to U/L-shaped side wirings 20.

Figure 31:
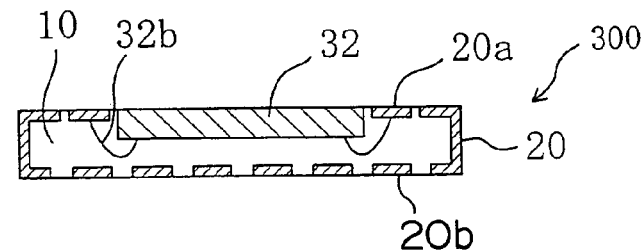

The configuration of the module 300 shown in FIG. 30 may be turned upside down, resulting in a configuration as shown in FIG. 31. The construction of the module 300 shown in FIG. 31 may be the same as that shown in FIG. 30, or may differ from that shown in FIG. 30. For example, in the configuration shown in FIG. 31, the positional relation between a terminal to which a component is mounted and a terminal which is employed for mounting the module to another board may be opposite to that in the configuration shown in FIG. 30.

Figure 32:
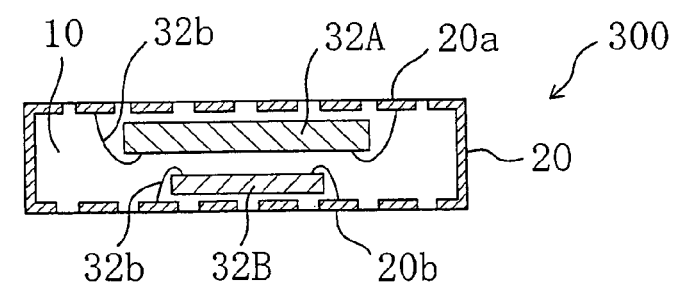

A module with a built-in component 300 shown in FIG. 32 has a configuration wherein two electronic components, for example, semiconductor devices 32A and 32B are stacked with a space in a sheet substrate 10. The semiconductor device 32A (bare chip) is connected to terminals 20*a* via metal thin wires 32*b*. The terminals 20*a* are connected to U/L-shaped side wirings 20. The semiconductor device 32*b* (bare chip) is connected to terminals 20*b* via other metal thin wires 32*b*. The terminals 20*b* are connected to the U/L-shaped side wirings 20. Further, another electronic component (such as a passive component (chip part)) may be additionally disposed within the sheet substrate 10.

Figure 33:
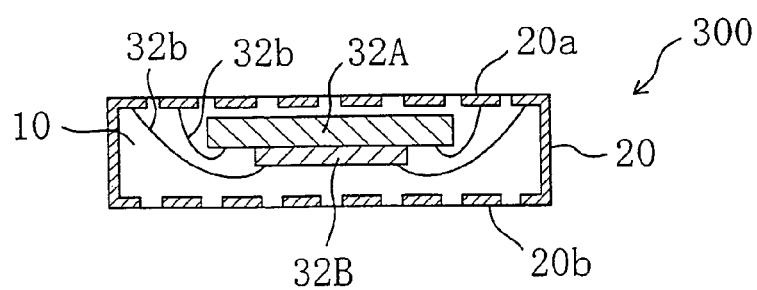

In the case where a plurality of electronic components 32A and 32B are embedded, they may be built up in contact with each other as shown in FIG. 33, that is, they may be used in a stacked state.

Figure 34:
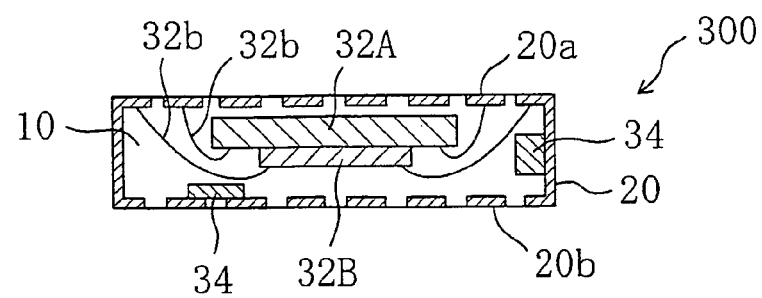

The module 300 as shown in FIG. 33 may further have electronic components 34 such as chip parts as shown in FIG. 34.

Each of the modules 300 shown in FIGS. 28 to 31 has a construction wherein a part of the electronic component 32 is exposed on a surface of the sheet substrate 10, while each of the module 300 shown in FIGS. 32 to 34 and FIGS. 35 to 38 has a construction wherein the entire of the electronic component 32 is disposed within the sheet substrate 10 and not exposed (that is, completely buried in the sheet substrate 10). It is clearly understood from these drawings that in the present invention, the "module with a built-in component" means a module wherein at least a part of at least one electronic component is disposed (that is, included) within the substrate. Those skilled in the art can easily determine whether or not a module has a built-in component.

Such a module with a built-in electronic component has a substrate wherein an electronic component is embedded. Here, "embedding" means a construction wherein at least one surface of the electronic component is exposed on the surface of the sheet substrate and substantially flush with the surface of the sheet substrate (for example, the constructions as shown in FIGS. 28 to 31) or a construction wherein the electronic component is substantially enclosed within the sheet substrate (for example, the constructions as shown in FIGS. 32 to 38). Here, "the surface of the electronic component" means a surface of a main body of the electronic component. The surfaces of elements which protrude from the main body, such as a terminal, lead and a protruded connection electrode which is attached to the electronic component are disregarded.

Figure 35:
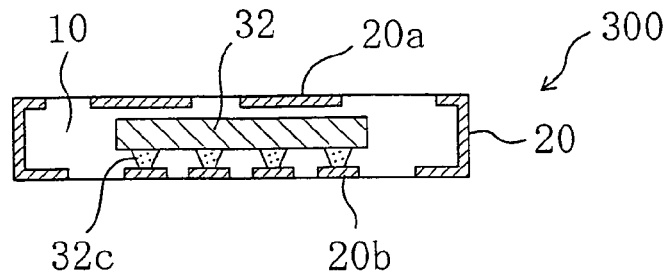

A module with a built-in component 300 shown in FIG. 35 has a construction wherein bumps 32c are formed on a semiconductor device 32 (bare chip) that is an electronic component and a bumps 32c are connected to terminals 20b which are connected to U/L-shaped side wirings 20. The bump 32c may be, for example, a gold bump, and formed on device terminals (not shown) of the bare chip 32.

Figure 36:
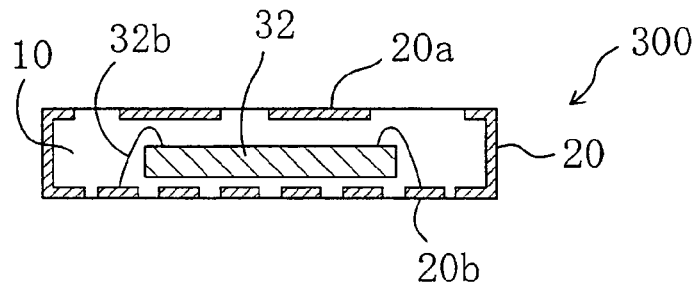

A module with a built-in component 300 shown in FIG. 36 has a construction wherein a semiconductor device 32 (bare chip) is connected to terminals 20b with a metal thin wire 32b and the terminals 20b are connected to U/L-shaped side wirings 20. This module 300 may be produced by the second production method which is described with reference to FIG. 57.

Figure 37:
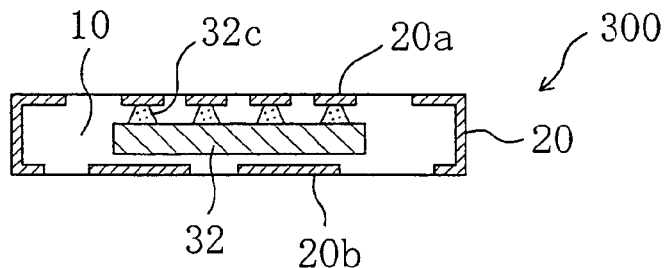
Figure 38:
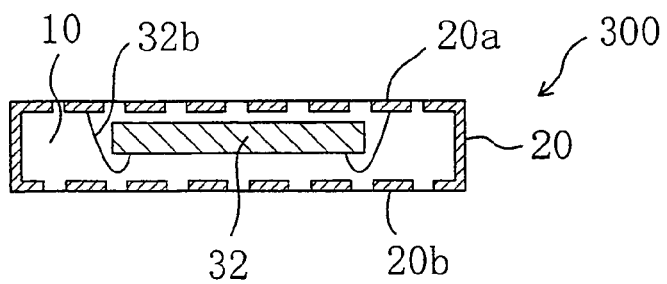

The configurations of the modules 300 shown in FIGS. 35 and 36 may be turned upside down, resulting in configurations as shown in FIGS. 37 and 38. The constructions of the modules 300 shown in FIGS. 37 and 38 may be the same as those shown in FIGS. 35 and 36 respectively or may differ from those shown in FIGS. 35 and 36. For example, in the configuration shown in FIG. 35 (or 36), the positional relation between a terminal to which a component is mounted and a terminal which is employed for mounting the module to another board may be opposite to that in the configuration shown in FIG. 37 (or 38).

Figure 39:
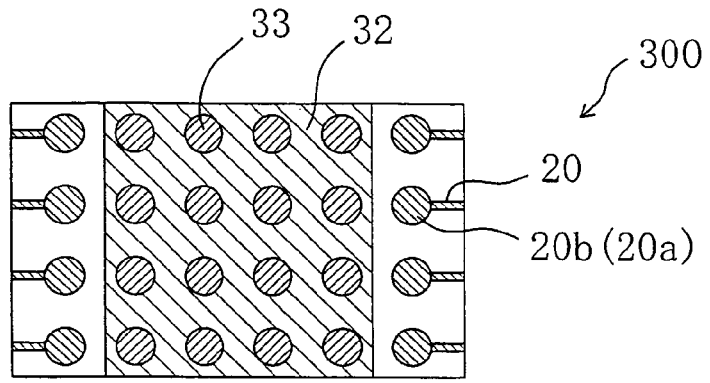
FIGS. 39 to 41 are bottom views of examples of a module with a built-in component 300 in accordance with the seventh embodiment of the present invention.

The bottom view shown in FIG. 39 shows an arrangement of terminals 33 on a bottom surface of the module 300 shown in FIG. 28. When the terminal 33 is a solder ball, a solder resist may be preferably formed on a surface of the semiconductor device 32. Other embodiments described above have a similar terminal arrangement on its surface. For example, in the module shown in FIG. 22, when the wirings 20b' are formed as terminals, an arrangement of the terminals is similar to that shown in FIG. 39, although the semiconductor device 32 is not exposed on the bottom surface. In the module shown in FIG. 24, when the wirings 20a' are formed as terminals, an arrangement of the terminals is similar to that shown in FIG. 39, although the semiconductor device 32 is not exposed.

Figure 40:
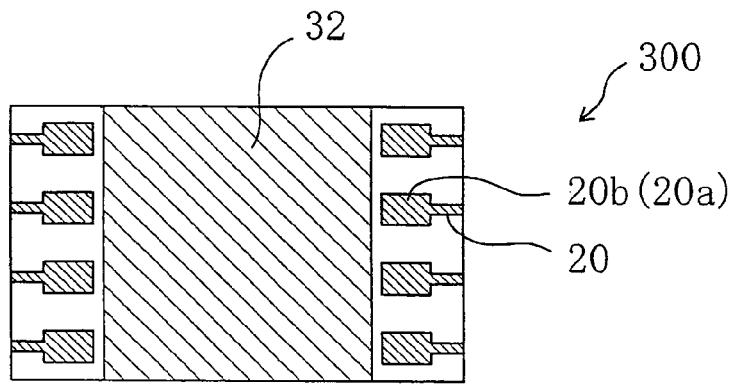

A bottom view shown in FIG. 40 shows an arrangement of terminals 33 on a bottom surface of the module 300 shown in FIG. 23. In the module shown in FIG. 23, the semiconductor device 32 is not exposed on the bottom configuration shown in FIG. 40 and the material of the sheet substrate covers the bottom surface of the semiconductor device 32. In the drawing, the position of the semiconductor device 32 is shown for better understanding. Further, the terminal arrangement shown in FIG. 40 corresponds to the upper surface of the module 300 as shown in FIG. 25.

Figure 41:
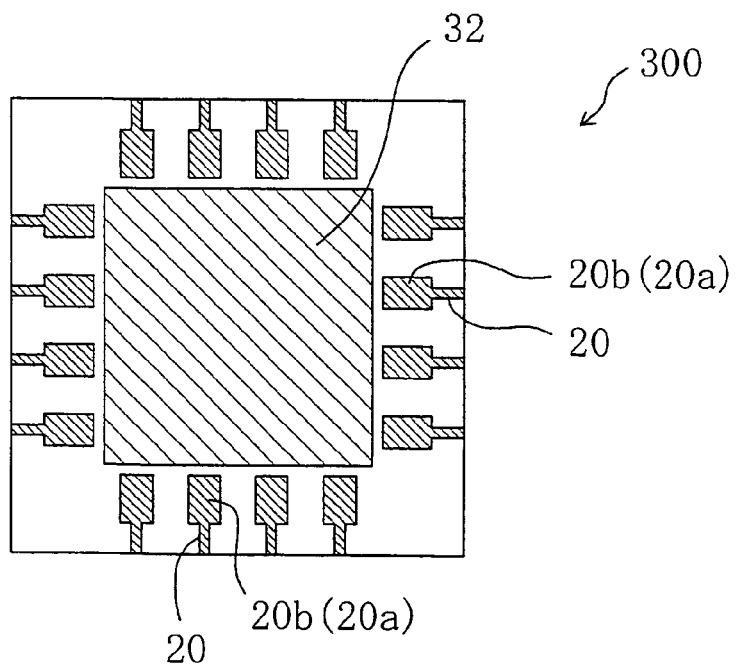

FIG. 41 is a bottom view of the module, similarly to FIG. 40. The terminal arrangement shown in FIG. 41 differs from that shown in FIG. 40 in that the land 20b (or land 20a) and the U/L-shaped side wirings 20 are arranged on four sides of the sheet substrate. Each of the lands 20b shown in FIGS. 40 and 41 is a square land. The land may be a round land as shown in FIG. 39. On the other hand, the round land shown in FIG. 39 may be a square land.

Figure 42:
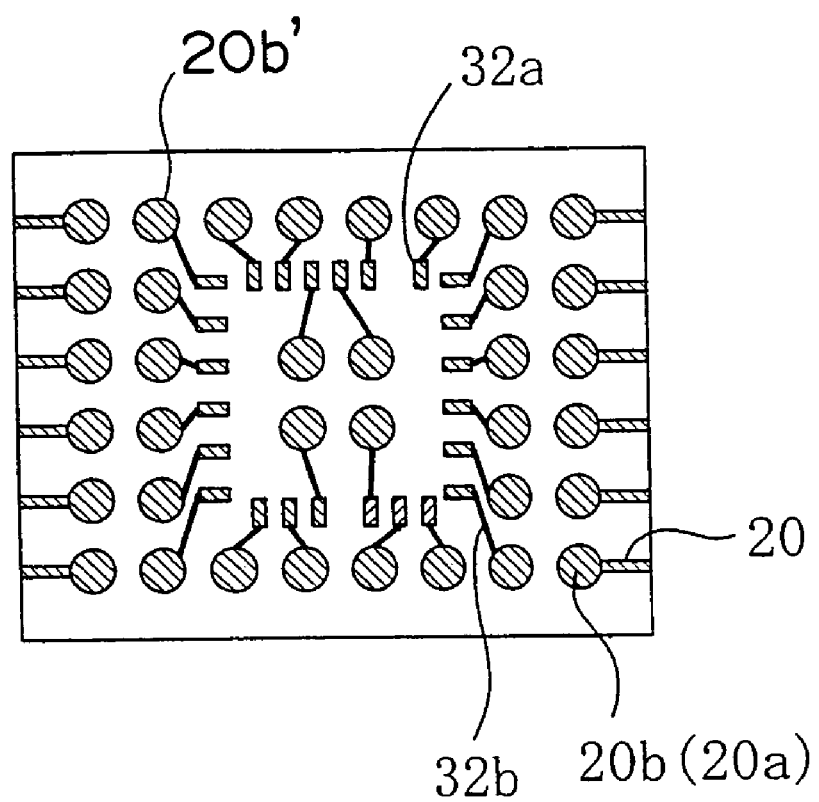
FIG. 42 is a bottom view which schematically shows an arrangement of terminals of a semiconductor device and wirings in a module with a built-in component 300 in accordance with the seventh embodiment of the present invention.

FIG. 42 schematically shows an example of an arrangement of land wirings 20b' (or 20a') and lands 20b (or 20a). The land wirings 20b' are connected to terminal 32a of a semiconductor device 32 (which is not shown because it is enclosed within the sheet substrate) through a metal thin wire 32b and the lands 20b are connected to U/L-shaped side wirings 20. The terminals 32 may be typically buried in the sheet substrate and not exposed. In another embodiment, the terminals 32 may be exposed on the lower (or the upper) surface of the sheet substrate or may be protruded from the surface of the sheet substrate. In the embodiment shown in FIG. 42, the land wirings 20b' are not electrically connected to the U/L-shaped side wirings. Alternatively, the land wirings 20b' may be electrically connected to the U/L-shaped side wiring. Alternatively, at least one of the land wirings 20b' may be the land 20b which are connected to the U/L-shaped side wiring 20.

Each of the modules with a built-in component 300 shown in FIGS. 43 to 49 has a configuration wherein an electronic component is placed on the upper surface of the module. These are described below.

Figure 43:
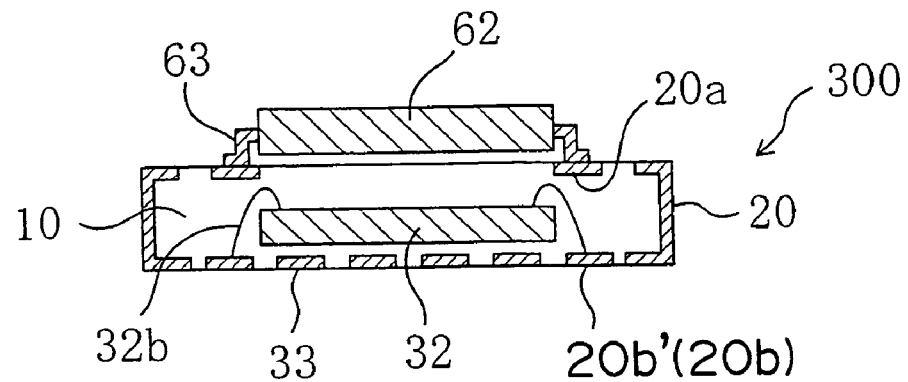
FIGS. 43 to 55 are cross-sectional views of examples of a module with a built-in component 300 in accordance with the seventh embodiment of the present invention, respectively.

A module with a built-in component 300 shown in FIG. 43 has a configuration wherein a semiconductor package 62 is disposed on the upper surface thereof (that is, on the upper surface of the sheet substrate 10 which has the built-in semiconductor device 32). Leads 63 of the semiconductor package 62 are connected to terminals 20a which are connected to U/L-shaped side wirings. The semiconductor device 32 (bare chip) is connected to wiring 20b' (or land 20b) with a metal thin wire 32b. The wirings 20b' may be separate lands or may be connected to another wiring. The land 20b are connected to the U/L-shaped side wirings 20.

Figure 44:
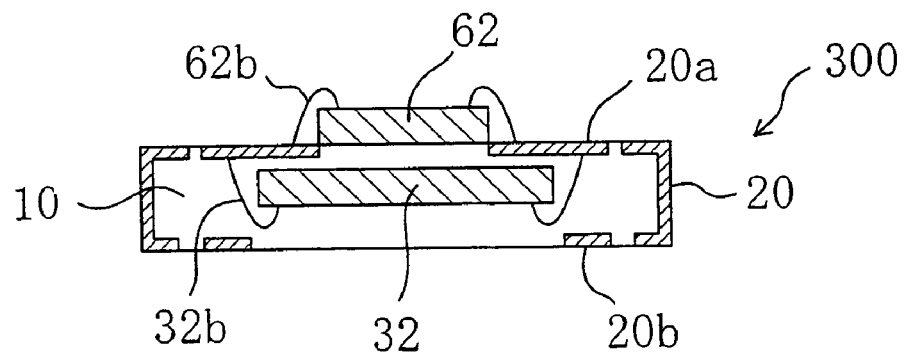
Figure 45:
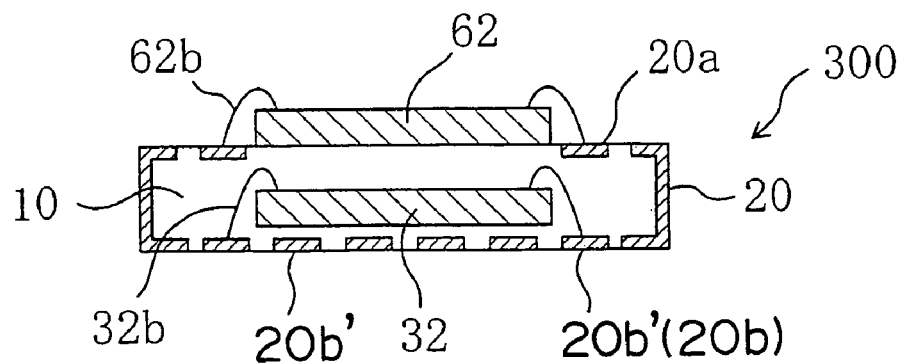

A module with a built-in component 300 shown in FIG. 44 has a configuration wherein a bare chip 62 is placed on the upper surface of the sheet substrate 10. The bare chip 62 is connected to lands 20a with a metal thin wire 62b. The lands 20a are connected to upper wiring portion of U/L-shaped side wirings 20 on the upper surface of a sheet substrate 10. Also the semiconductor device (bare chip) 32 is connected to the land 20a through a metal thin wire 32b. In a configuration shown in FIG. 45, a semiconductor device (bare chip) 32 is connected to lands 20b' (or lands 20b connected to the U/L-shaped side wirings) through a metal thin wire 32b.

Figure 46:
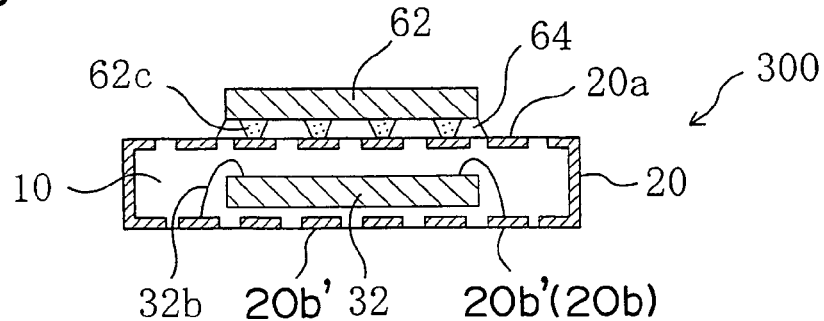

A module with a built-in component 300 shown in FIG. 46 has a configuration wherein a semiconductor device 63 (bare chip) having bumps 62c is disposed on the upper surface of the sheet substrate 10. The bump 62c is connected to a terminal 20a which is connected to a U/L-shaped side wiring 20. A semiconductor device 32 (bare chip) is connected to wirings 20b' (or lands 20b) with a metal thin wire 32b. The wirings 20b' may be separate lands or may be connected to another wiring. The lands 20b are connected to the U/L-shaped side wirings 20. In the embodiment shown in FIG. 46, an under filling 64 is formed between the semiconductor device 62c and the upper surface of the sheet substrate 10. The under filling 64 can suppress a void formation under the semiconductor device 32 and enhance an adhesion between the semiconductor device 32 and the sheet substrate 10. Further, a difference in thermal expansion between the semiconductor device 32 and the sheet substrate 10 can be relieved by selecting an appropriate material for the under filling.

Figure 47:
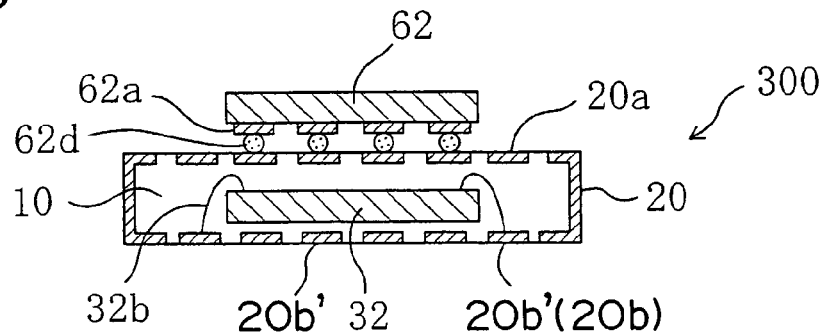

A module with a built-in component 300 shown in FIG. 47 has a configuration wherein a semiconductor device 62 with solder balls 62d attached to device terminals 62a is disposed on a wiring pattern on an upper surface of a sheet substrate 10. The semiconductor device 62 (bare chip) is connected to wiring 20b' or land 20b through a metal thin wire 32b. The wirings 20b' may be separate lands or may be connected to another wiring. The land 20b is connected to a U/L-shaped side wiring.

Figure 48:
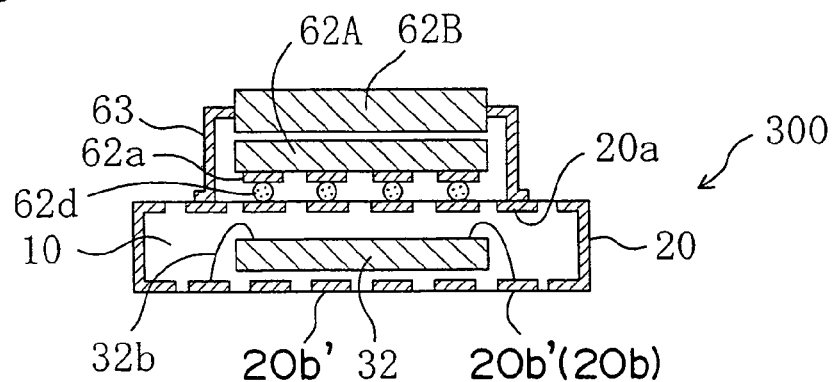
Figure 49:
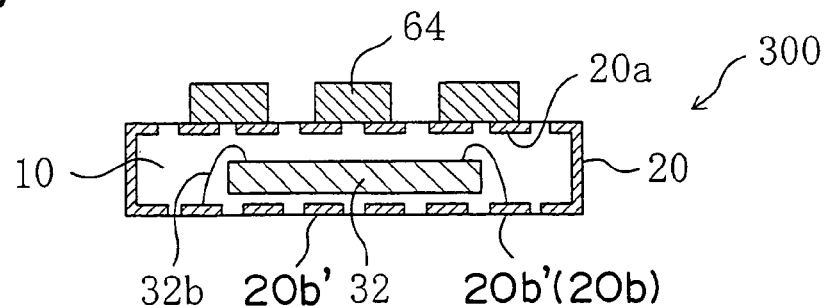
Figure 50:
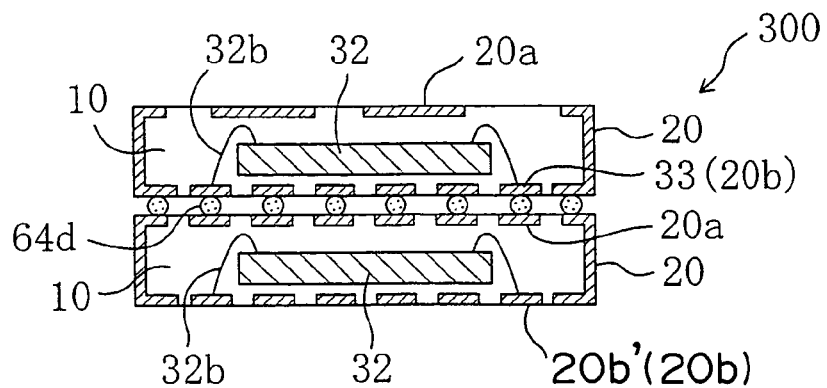

A module with a built-in component 300 shown in FIG. 48 has a construction wherein two semiconductor devices 62A and 62B are provided on the upper side of a sheet substrate 10. The embodiment shown in FIG. 48 can be obtained by placing the semiconductor device 62B having leads 63 above the semiconductor device 62A of the module 300 as shown in FIG. 47 and connecting the leads 63 to lands 20*a* which are connected to U/L-shaped side wirings 20.

In the embodiments shown in FIGS. 43 to 48, the semiconductor device 63 is placed as an electronic component on the upper surface of the sheet substrate 10. Alternatively, passive components 64 (such as chip parts) may be disposed as the electronic component. Alternatively, both of the semiconductor device and the passive component may be mounted.

As described above, a multilayer board may be fabricated by stacking a plurality of modules with built-in components of the present invention. A module with a built-in component shown in FIG. 50 has a construction wherein two modules are stacked. In this embodiment, the upper module and the lower module are electrically connected through connection members 64*d* (solder balls). The number of the stacked modules are not limited to two, and three or more modules can be stacked.

Figure 51:
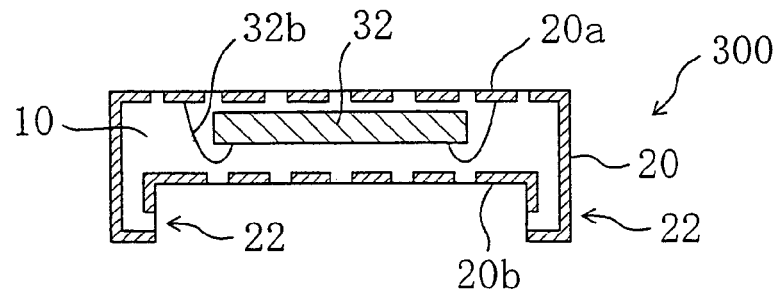
Figure 52:
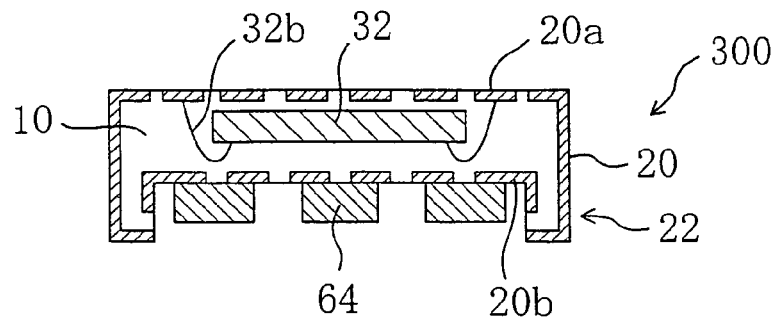
Figure 53:
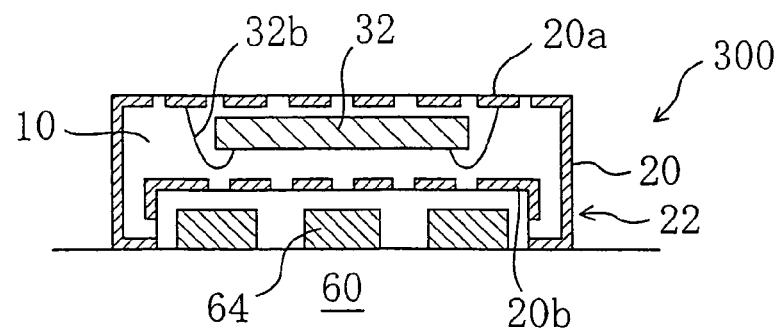

As described above, a module with a built-in component of the present invention can relatively easily assume any form. For example, it is possible to fabricate a module with a built-in component 300 which has a sheet substrate 10 with convexities 22 as shown in FIG. 51. Further, as shown in FIG. 52, chip parts 64 can be mounted on a bottom surface of a concavity of the sheet substrate 10 which concavity exists between two convexities 22. In another embodiment, as shown in FIG. 53, the module may be mounted on a wiring board 60 (a mother board) so that the concavity of the sheet substrate 10 accommodates chip parts 64 disposed on the board 60.

Figure 54:
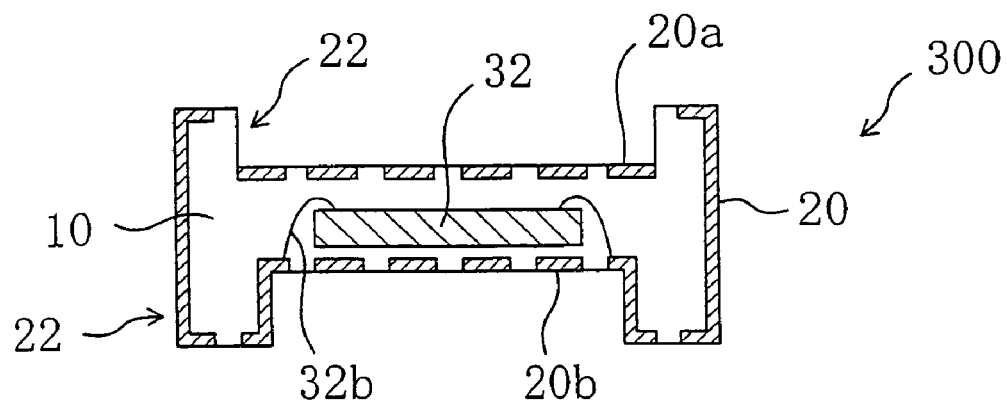
Figure 55:
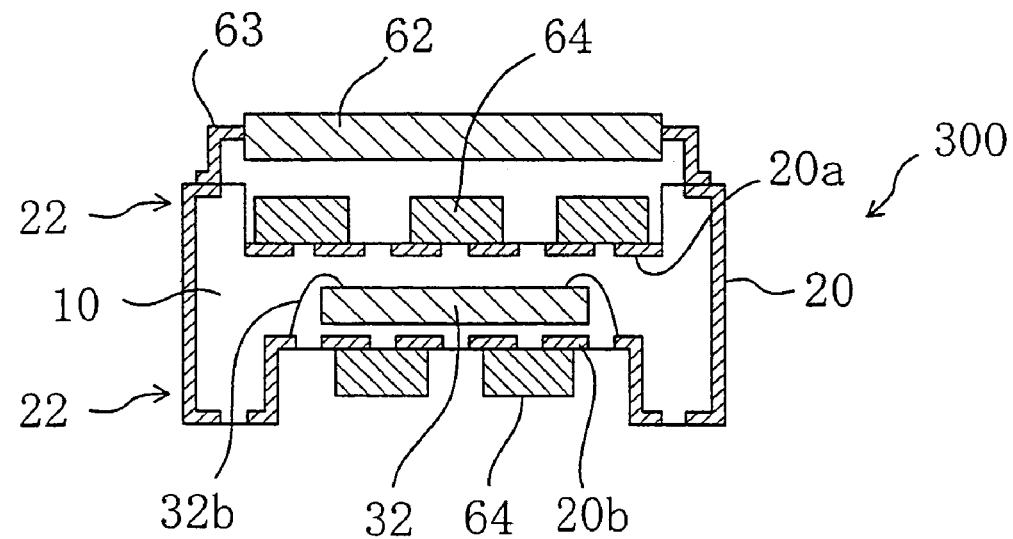

Further, as shown in FIG. 54, the convexities 22 may be formed on both of the upper and lower sides of the sheet substrate 10. Furthermore, in a module with a built-in component 300 as shown in FIG. 55, chip parts 64 are mounted on the bottom surfaces of concavities formed by the top and the bottom convexities 22. In the embodiment shown in FIG. 55, leads 63 of the semiconductor device 62 are connected to U/L-shaped side wirings 20.

The module with a built-in component of the present invention, for example the module 100, 200 or 300 in accordance with the above embodiments, may be housed in a casing so as to construct a portable electronic equipment together with another component of the portable electronic equipment. The module of the present invention may be preferably used for an electronic equipment whose mounting area is severely restricted, for example, a cellular phone, and other portable electronic equipments (such as a PDA). Further, the module of the present invention can be produced relatively efficiently by the method for producing a module with a built-in component of the present invention.

What is claimed is:

1. A module with a built-in component which comprises:
   a material forming an insulating sheet substrate which has an upper surface and a lower surface which is opposite to the upper surface, and a side surface which connects the upper and the lower surfaces;
   at least one wiring which comprises:
   i) a side-surface wiring portion which is disposed on at least a part of the side surface; and
   ii) at least one of (a) an upper-surface wiring portion connected to the side-surface wiring portion and disposed on at least a part of the upper surface and (b) a lower surface wiring portion connected to the side-surface wiring portion and disposed on at least a part of the lower surface; and
   an electronic component which is disposed within the sheet substrate,
   wherein at least a part of the electronic component is covered with the material which forms the insulating sheet substrate;
   wherein no via connection is in the insulating sheet substrate;
   wherein at least a portion of a top surface of said side-surface wiring portion of said at least one wiring is disposed at a position that is interior of the sheet substrate with respect to the side surface of the sheet substrate.

2. The module of claim 1, wherein said at least one wiring electrically connects an electrical element on the upper surface and an electrical element on the lower surface.

3. The module of claim 1, wherein at least one end portion of said at least one wiring is electrically connected to a land and said at least one wiring and said land are formed integrally.

4. The module of claim 1, wherein said at least one wiring is electrically connected to the electronic component.

5. The module of claim 1, wherein the material forming the insulating sheet substrate contains a resin.

6. The module of claim 5, wherein the resin is at least one of a thermosetting resin and a thermoplastic resin.

7. The module of claim 1, wherein the material forming the insulating sheet substrate comprises a composite material containing a rein and an inorganic filler.

8. The module of claim 1, wherein the upper surface of the sheet substrate has an approximate rectangular shape having a long side and a narrow side shorter than the long side.

9. The module of claim 1, wherein the electronic component is a semiconductor device.

10. The module of claim 1, wherein the electronic component is a first electronic component, and further comprising at least one additional electronic component disposed within the sheet substrate, wherein said at least one additional electronic component is of a different type than said first electronic component, and wherein at least one of said first and said at least one additional electronic component is a semiconductor device.

11. The module of claim 1, further comprising another module having a built-in component stacked on one of the upper and lower surfaces.

12. The module of claim 1, further comprising another electronic component disposed on one of the upper and lower surfaces.

13. The module of claim 1, wherein said at least a portion of said side-surface wiring portion of said at least one wiring is sunk in the side surface of the sheet substrate.

14. The module of claim 13, wherein the entire top surface of said side-surface portion of said at least one wiring is disposed at a position that is interior of the sheet substrate with respect to the side surface of the sheet substrate.

15. The module of claim 1, wherein a portion of said at least one wiring is placed at a corner of the sheet substrate and is disposed at an interior position of the sheet substrate as compared with a surface of the sheet substrate which defines the corner of the sheet substrate.

16. The module of claim 1, wherein a plurality of said at least one wiring define a coplanar line.

17. The module of claim 1, further comprising a shield member within the sheet substrate.

18. The module of claim 17, wherein the electronic component is a first electronic component, and further comprising an additional electronic component disposed within the sheet substrate, wherein one of the first electronic component and the additional electronic component is disposed between the shield member and the upper surface of the sheet substrate and the other of the first electronic component and the additional electronic component is disposed between the shield member and the lower surface of the sheet substrate.

19. The module of claim 1, wherein a portion of the electronic component is exposed on a surface of the sheet substrate and a heat releasing member is disposed in contact with the exposed portion of the electronic component.

20. The module of claim 1, wherein the sheet substrate is formed by folding a sheet containing resin in a semi-cured state and then completely curing the folded sheet.

21. The module of claim 1, wherein the sheet substrate with said at least one wiring are formed by folding a sheet containing resin in a semi-cured state and a wiring pattern comprising a portion which is to form said at least one wiring, and then completely curing the folded sheet.

22. Electronic equipment comprising the module of claim 1 and a casing housing the module.

23. A module with a built-in component which comprises:
   a material forming an insulating sheet substrate which has an upper surface and a lower surface which is opposite to the upper surface, and a side surface which connects the upper and the lower surfaces;
   at least one wiring which comprises:
      i) a side-surface wiring portion which is disposed on at least a part of the side surface; and
      ii) at least one of (a) an upper-surface wiring portion connected to the side-surface wiring portion and disposed on at least a part of the upper surface and (b) a lower surface wiring portion connected to the side-surface wiring portion and disposed on at least a part of the lower surface; and
   an electronic component which is disposed within the sheet substrate,
   wherein the electronic component is embedded in the material which forms the insulating sheet substrate;
   wherein no via connection is in the insulating sheet substrate;
   wherein at least a portion of a top surface of said side-surface wiring portion of said at least one wiring is disposed at a position that is interior of the sheet substrate with respect to the side surface of the sheet substrate.

* * * * *